United States Patent
Wang et al.

(10) Patent No.: US 10,483,127 B2
(45) Date of Patent: Nov. 19, 2019

(54) METHODS FOR HIGH PRECISION PLASMA ETCHING OF SUBSTRATES

(71) Applicant: Tokyo Electron Limited, Tokyo (JP)

(72) Inventors: Mingmei Wang, Albany, NY (US);
Alok Ranjan, Mechanicville, NY (US);
Peter L. G. Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/200,122

(22) Filed: Nov. 26, 2018

(65) Prior Publication Data

US 2019/0096694 A1    Mar. 28, 2019

Related U.S. Application Data

(62) Division of application No. 14/795,625, filed on Jul. 9, 2015, now Pat. No. 10,211,065.

(Continued)

(51) Int. Cl.
*H01L 21/3213* (2006.01)
*H01J 37/32* (2006.01)
(Continued)

(52) U.S. Cl.
CPC .. *H01L 21/32136* (2013.01); *H01J 37/32082* (2013.01); *H01J 37/32146* (2013.01);
(Continued)

(58) Field of Classification Search
CPC .......... H01L 21/31116; H01L 21/3065; H01L 21/30655; H01L 21/31144;
(Continued)

(56) References Cited

U.S. PATENT DOCUMENTS 5,276,126 A * 1/1994 Rogler .................... C08G 8/24
427/240
5,368,685 A 11/1994 Kumihashi et al.
(Continued)

FOREIGN PATENT DOCUMENTS

JP         6-151360 A    5/1994
JP       2015-065215    9/2013
(Continued)

OTHER PUBLICATIONS

Office Action dated Aug. 24, 2017 in Korean Patent Application No. 10-2015-0098627 (w/ English translation).
(Continued)

*Primary Examiner* — Zandra V Smith
*Assistant Examiner* — John M Parker
(74) *Attorney, Agent, or Firm* — Oblon, McClelland, Maier & Neustadt, L.L.P.

(57) ABSTRACT

A plasma processing system and methods for high precision etching of microelectronic substrates. The system may include a combination of microwave and radio frequency (RF) power sources that may generate plasma conditions to remove monolayer(s). The system may generation a first plasma to form a thin adsorption layer on the surface of the microelectronic substrate. The adsorbed layer may be removed when the system transition to a second plasma. The differences between the first and second plasma may be include the ion energy proximate to the substrate. For example, the first plasma may have an ion energy of less than 20 eV and the second plasma may have an ion energy greater than 20 eV.

10 Claims, 12 Drawing Sheets

Related U.S. Application Data

(60) Provisional application No. 62/040,214, filed on Aug. 21, 2014, provisional application No. 62/022,856, filed on Jul. 10, 2014, provisional application No. 62/022,873, filed on Jul. 10, 2014.

(51) Int. Cl.
*H01L 21/311* (2006.01)
*H01L 21/3065* (2006.01)

(52) U.S. Cl.
CPC .. *H01J 37/32192* (2013.01); *H01J 37/32816* (2013.01); *H01L 21/30655* (2013.01); *H01L 21/31116* (2013.01)

(58) Field of Classification Search
CPC ......... H01L 21/67069; H01L 21/32137; H01L 21/32136; H01L 21/31138; H01L 21/32139
See application file for complete search history.

(56) References Cited

U.S. PATENT DOCUMENTS

| | | | |
|---|---|---|---|
| 6,270,634 B1 | 8/2001 | Kumar et al. | |
| 6,379,574 B1* | 4/2002 | Ou-Yang | H01L 21/02063 134/1.2 |
| 7,335,602 B2 | 2/2008 | Rauf et al. | |
| 2003/0164354 A1* | 9/2003 | Hsieh | H01J 37/32458 216/22 |
| 2005/0079672 A1* | 4/2005 | Ouyang | H01L 21/31116 438/257 |
| 2013/0149445 A1 | 6/2013 | Guenther et al. | |
| 2014/0302682 A1 | 10/2014 | Muto et al. | |
| 2016/0196957 A1 | 7/2016 | Takayama et al. | |
| 2016/0276582 A1 | 9/2016 | Hashimoto et al. | |

FOREIGN PATENT DOCUMENTS

| | | |
|---|---|---|
| KR | 10-2007-0089062 A | 8/2007 |
| KR | 10-2013-0015009 A | 2/2013 |
| KR | 10-2014-0016920 A | 2/2014 |
| KR | 10-2014-0082850 A | 7/2014 |
| TW | 200845191 A | 11/2008 |
| TW | 201137968 A1 | 11/2011 |
| TW | 201324610 A1 | 6/2013 |
| TW | 201330100 A1 | 7/2013 |
| TW | 201344790 A | 11/2013 |
| TW | 201417170 A | 5/2014 |

OTHER PUBLICATIONS

Office Action dated Apr. 18, 2017 in Korean Patent Application No. 10-2015-0098627.
Office Action dated Mar. 31, 2017 in Chinese Patent Application No. 104122435 (w/ English translation).
Office Action dated Aug. 29, 2016 in Korean Patent Application No. 10-2015-0098627 (w/ English language translation).
Combined Office Action and Search Report dated Sep. 6, 2016 in Taiwanese Patent Application No. 104122435 (w/ English language translation).
Samantha Tan, et al., "Highly Selective Directional Atomic Layer Etching of Silicon" ECS Journal of Solid State Science and Technology, vol. 4, No. 6, 2015, pp. N5010-N5012.
Satish D. Athavale, et al., "Realization of atomic layer etching of silicon" American Vacuum Society, JVST B—Microelectronics and Nanometer Structures, Journal of Vacuum Science & Technology B, vol. 14, No. 6, 1996, pp. 3702-3705.

* cited by examiner

METHODS FOR HIGH PRECISION PLASMA ETCHING OF SUBSTRATES

CROSS REFERENCE TO RELATED APPLICATIONS

The present application is a Division of U.S. patent application Ser. No. 14/795,625, filed Jul. 9, 2015, which claims the benefit of U.S. provisional patent applications No. 62/022,856, filed on Jul. 10, 2014, 62/040,214 filed on Aug. 21, 2014, and 62/022,873 filed on Jul. 10, 2014 which are all incorporated herein by reference in their entirety.

FIELD OF THE DISCLOSURE

This invention relates to semiconductor processing technology, and more particularly, to apparatus and methods for controlling plasma properties for treating a semiconductor substrate.

BACKGROUND

The geometries of microelectronic features continue to scale to smaller sizes and increase in complexity. Accordingly, the patterning techniques used to manufacture microelectronic devices may need to become more precise to create smaller features and minimize damage to the films during manufacturing. Previously, selective etching or high precision etching has been attempted by alternating between precursor deposition (passivation) and etching using plasma processing. However, these conventional approaches have been plagued by aspect ratio, profile variation, and cycle time issues. Accordingly, new high precision etching techniques that may overcome the aforementioned issues may be desirable.

SUMMARY

This disclosure relates to a plasma processing methods for high precision etching of substrates used to manufacture microelectronic devices. High precision etching may include the systematic removal of film monolayers over a period time, until a targeted film thickness is achieved or the film is removed from the substrate. The high precision etching may be enabled by exposing the substrate to plasma that may be transitioned between an adsorption state and a desorption state. For example, the adsorption plasma may be used to pre-treat or prepare portions of the substrate that may be removed by the desorption plasma. In one embodiment, the adsorption treatment may increase the etch selectivity between the substrate surface to the underlying substrate. Having a higher etch selectivity at the surface of the substrate compared to the underlying layer may enable the removal or etching of a surface monolayer(s) while minimizing the removal of and/or damage to the underlying substrate by plasma being used to remove the monolayer(s). In one embodiment, the etch selectivity between the monolayer and the underlying substrate may be high enough that the removal process may be self-limiting. In this way, the plasma treatment may aggressively or systematically remove the monolayer(s) without removing the underlying layer, in that the plasma treatment appears not to etch the underlying substrate despite being exposed to the plasma for a relatively extended period. High precision etching of the substrate may be implemented by transitioning between adsorption and desorption plasma may be implemented using variety of plasma processing techniques.

In one embodiment, the adsorption plasma (e.g., first plasma) may be generated by applying a first energy source (e.g., microwave) to a process gas mixture in a plasma process chamber. The gas mixture may include a reactant gas (e.g., $Cl_x$-containing gas, $F_x$-containing gas, or $O_x$-containing gas) and a dilution gas (e.g., Ar, He, combinations thereof, etc.) that may be relatively inert to the substrate, when compared to the reactant gas, under the adsorption plasma conditions. The process conditions for the high precision etching method may include, but are not limited to, chamber pressure, power, gas mixture composition and concentration. In this instance, during adsorption, the chamber pressure may be greater than 40 mTorr and be up to 500 mTorr and the first energy source may apply a power between 500 W and 10,000 W at a frequency of about 2.45 GHz or within a range of 300 MHz to 10 GHz to a source electrode disposed in the plasma processing chamber. The process gas mixture may include a reactant gas that may between 10% and 100% by volume during the adsorption process. The ions and radicals generated in the adsorption plasma may be used to treat the surface of the substrate for a time up to 5000 ms, or more particularly between 00 ms and 500 ms.

During the first plasma treatment, the chemical composition of the substrate surface may be halogenated or oxidized depending on the type of reactant gas. In practice, the adsorbed or oxidized layer on the surface of the substrate has different chemical and physical properties that may distinguishable from the underlying substrate. These differences may include, but are not limited to, differences in etch rate under certain plasma conditions, such that the adsorbed layer is more likely to be removed at a higher rate than the underlying substrate when exposed to the same plasma. Hence, transitioning from an adsorption plasma to a desorption plasma may enable a highly selective etch process that may be repeated until a desired amount of the substrate has been removed.

The adsorption plasma may be transitioned to a desorption plasma by altering the gas mixture, pressure, power, or a combination thereof. One or more gas purges may be implemented between the adsorption plasma and the desorption plasma, but are not required.

In one embodiment, the transition to a desorption plasma may occur by varying the gas mixture and the power to generate ions that may selectively remove portions (e.g., monolayer(s)) of the substrate treated or formed by the adsorption plasma. In one specific embodiment, the gas mixture may include up to 100% by volume of the dilution gas or down to 0% of the reactant gas. In other embodiments, the gas mixture may transition to less than 10% by volume of the reactant gas with the remainder being the dilution gas. The microwave power, pressure, and/or substrate temperature may be optimized to achieve a desired etch rate. In one embodiment, the desorption plasma may be generated by applying a second energy source (e.g., bias power) to the gas mixture, in addition to the microwave power, although the microwave power may not be required. The bias power may be supplied by a radio-frequency (RF) power source that may be in electrical communication with a bias electrode that is proximate to the substrate. In one specific embodiment, the bias electrode may opposite of the source electrode and the substrate may be disposed between the source and bias electrodes. The desorption plasma, or bias power, may be active between 100 ms and 3000 ms. In one specific embodiment, the desorption time may be about 300 ms to 550 ms. Generally, the desorption time may be less than 500 ms to address cycle time constraints.

Following the removal of the adsorbed portion of the substrate, the desorption plasma may transition back to an adsorption plasma that treats newly exposed portions or surface of the substrate. In certain embodiments, the transition between the adsorption and desorption plasma may occur in an asymmetrical manner, such that adsorption plasma or the desorption plasma may be exposed to the substrate for different times. The amount of time that it takes to transition may also vary depending on the any purging or gas exchanging that may be needed between the two treatments, but the purging may not be required.

In one embodiment, the desorption plasma may be active when the bias power may be applied to the process gas mixture and may extend between 300 ms and 5000 ms, depending on the desorption process gas mixture, adsorbed layer composition, and/or substrate composition. In contrast, the adsorption plasma may be active when the bias power may not be applied to the process gas mixture. However, the first energy source may be applied to the adsorption process gas mixture and the desorption gas mixture. In one specific embodiment, and the desorption time may be about 450 ms. Hence, the period of time for the adsorption plasma and the desorption plasma may be about 550 ms. This may or may not include gas purging and/or gas exchanging times during the transitioning. In other embodiments, the period of time for the same substrate may increase or decrease depending on the aspect ratio changes of the substrate or other process variables.

The adsorption/desorption processing scheme may also be characterized by the conditions that may be generated within the process gas mixture proximate (e.g., <10 mm) to the substrate. Plasma generation may be done by applying electromagnetic energy to an electrically neutral gas to cause electrons to be released from gas molecules that become positively charged (e.g., ion) as result of the lost electron. The ions may be characterized as a molecule or atom where the total number of electrons are not equal to the total number of protons resulting in a positive charge. Free electrons may attach to neutral molecules or atoms resulting in ions with a negative charge. Molecular or atomic radicals (e.g., molecules or atoms with at least one unpaired electron) may also be generated from the electrically neutral gas when exposed to the electromagnetic energy. Generally, the radicals may have a neutral, positive, or negative charge and may have high chemical reactivity relative to the dilution gas ions. However, the dilution gas may be an atomic gas and may not generate radicals or may generate radicals at a very small amount relative to the radicals generated by the reactant gas mixtures. The dilution gas primarily supplies ions and the radicals may come from the molecules inserted into the plasma and may influence how the ions drive surface reactions at the substrate. The combination and concentration of the ions and radicals may influence how plasma interacts with the substrate. The adsorption and desorption plasma may have different plasma characteristics (e.g, radical flux, ion flux, ion energy, etc.) to achieve the desired result on the substrate.

The plasma characteristics may include, but are not limited to, radical-to-ion flux ratio (RIR) and the ion energy found within plasma. The RIR may be a dimensionless parameter that indicates a how active or energetic the ions and radicals are with respect to each other within the plasma. Ion energy that may be expressed as the average ion energy incident on a substrate measured in electron volts (eV) or an ion energy distribution function. Flux and ion energy will be described in greater detail in the Detailed Description below. The adsorption (e.g., first plasma) and the desorption (e.g., second plasma) phases may be characterized relative to each other, in that the RIR and ion energy levels may transition between different conditions to enable the formation of the adsorbed layer and the removal of the adsorbed layer from the substrate. The adsorbed layer may comprise a composition that may include the reactive radicals and substrate atoms and/or molecules that react with each other when the adsorption plasma is exposed to the substrate.

In one embodiment, the adsorption plasma may comprise an RIR of at least 100:1 in conjunction with an ion energy (e.g., first ion energy) being less than 20 eV. However, the adsorption process may be tuned target specific ion energy regimes to achieve desired results. In one specific embodiment, the adsorption process may be implemented with an ion energy that may be less than 10 eV. In another specific embodiment, the ion energy may range between 5 eV and 20 eV or 5 eV and 10 eV. The adsorption plasma may be generated using a variety of process conditions disclosed herein below. However, these process conditions are not intended to limit the scope of the claims are provided for the purpose of explanation and not limitation. The adsorption plasma may be generated using a pressure of at least 40 mTorr up to about 500 mTorr. The process gas mixture may include a reactant gas (e.g, oxygen-containing gas, nitrogen-containing gas, hydrogen containing gas, carbon containing gas, a halogen-containing gas), a dilution gas (e.g., argon, helium, etc.), or a combination thereof. In addition to the ion energy, the process conditions may also be optimized to enable a RIR from 100:1 up to 1000:1.

Selective removal of the substrate may occur when the plasma chamber system transitions to a desorption plasma that may have a different RIR and ion energy than the adsorption plasma. For example, the desorption plasma may have a lower RIR (e.g., ions and little to no radicals) and high ion energy relative to the adsorption plasma. In one specific embodiment, the desorption plasma ion energy greater than 20 eV (e.g., ~40 eV). However, the second ion energy may be bounded by a sputter threshold that prevents damaging the substrate or the plasma chamber. For example, in one specific embodiment, the ion energy of the desorption plasma may be less than 70 eV. The desorption plasma may be generated using a variety of process conditions disclosed herein. However, these process conditions are not intended to limit the scope of the claims are provided for the purpose of explanation and not limitation.

In one embodiment, the desorption plasma may be generated using a pressure of at least 5 mTorr up to about 500 mTorr. In one specific embodiment, the process gas mixture may include dilution gas(es) and no reactive gases. However, in other embodiments the process gas mixture may include a combination of dilution gas(es) with very small amounts of reactant gas(es) relative to the adsorption process gas mixture. The process conditions may be optimized to enable a desorption plasma RIR that is lower than the adsorption plasma RIR. The desorption plasma, depending on the process gas mixture, may treat surface of the substrate that may enable highly selective removal of portions (e.g., halogenated, oxidized, etc.) of the substrate.

Although the plasma chamber may alternate between the adsorption and desorption plasma in an asymmetrical manner over a period of time to remove or expose portions of the substrate. The adsorption and desorption processing times may or may not include pre-plasma or post-plasma purges. For example, the transition between adsorption and desorption may be accomplished by using a continuous plasma over the period of time, such that gas mixture, power, pressure, or any combination thereof may be altered without extinguishing plasma within the process chamber. In other embodiments, the transition between the adsorption and desorption plasma may be done in a symmetrical manner, such that the processing times are the same or similar.

In addition to the embodiments described above, high precision plasma etching may include other chemistries and process sequences to enable selective removal of monolayer(s) from the substrate. Chemistry and process sequence selection may vary in view of the substrate surface composition, surface geometry and/or size, sub-surface composition, underlying geometry and/or size, desired etch rate, desired etch selectivity, or any combination thereof. However, the additional embodiments may still incorporate the principles of adsorption and desorption and the transition between those two states to etch monolayer(s) from the substrate.

In one embodiment, the adsorption chemistry may include a gas mixture that may include a reactant gas (oxygen-containing gas) and, possibly, a dilution gas (e.g., argon, helium, nitrogen) that may be used to generate an oxygen-based plasma that may oxidize portions of the substrate. The oxidation may be limited to a few monolayers, or even a single monolayer, and to exposed portions of the substrate that may have a much higher oxidation rate than other exposed portions of the substrate. In this way, the adsorption process (e.g., oxidation) may be selectively implemented across the substrate to specific features (e.g., trench, fin, etc.). The adsorption plasma may be formed by applying between 1000 W and 3000 W of electromagnetic energy (e.g., microwave) to the gas mixture that may be maintained at a pressure between 5 mTorr and 1000 mTorr. The adsorption time may range between 100 ms to 3000 ms.

Following the adsorption process, the plasma system may transition to a desorption process that may selectively remove the adsorbed layers, in that the adsorbed layer etch rate may be much higher than the removal rate of the other exposed substrate films and/or the underlying substrate where the adsorbed layer was formed. In this embodiment, the desorption plasma gas mixture may include a reactant gas (e.g., fluorocarbon-containing gas, $C_xF_xH_z$) and a dilution gas (e.g., argon, helium, nitrogen, or combination thereof). The desorption plasma may be formed by applying by more than type of electromagnetic energy to the gas mixture and/or substrate. For example, the gas mixture may be exposed to a microwave energy between 1000 W and 3000 W and RF energy between 10 W and 200 W while the pressure may be maintained between 5 mTorr and 1000 mTorr. The desorption time may range between 100 ms to 3000 ms.

In other embodiments, transitioning between the adsorption and desorption processes may include alternating the gas mixture flow while applying electromagnetic energy from at least two power sources during the adsorption and desorption processes. In one embodiment, the adsorption gas mixture may include oxygen, fluorine, and carbon elements to treat the substrate. The adsorption plasma may be generated by applying a source power and a bias power to the gas mixture while maintaining the pressure between 5 mTorr and 1000 mTorr. The source power may range between 1000 W and 3000 W with a driving frequency greater than 300 MHz. The bias power may range between 10 W and 200 W with a driving frequency less than 300 MHz.

The transition from adsorption to desorption may be enabled by changing the gas mixture to remove or reduce one or more reactant gases used to generate the adsorption plasma. However, this does not require that the power and pressure remain exactly the same magnitude, but the desorption process may include the application of the source power and the bias power to the plasma chamber. In one embodiment, the oxygen-containing gas may be removed from the process chamber, or at least reduced by at least 50% by volume within the process chamber. In other embodiments, the oxygen-containing gas may be reduced to a level that may not substantially impact the desorption process at the substrate as determined by a person of ordinary skill in the art of plasma processing. In one embodiment, the desorption plasma may be generated by applying a source power and a bias power to the gas mixture while maintaining the pressure between 5 mTorr and 1000 mTorr. The source power may range between 1000 W and 3000 W with a driving frequency greater than 300 MHz. The bias power may range between 10 W and 200 W with a driving frequency less than 300 MHz.

In another embodiment, the transition between the adsorption and desorption process may be altered over time during subsequent iterations monolayer(s) removal process. The changes may be done to account for geometry and/or composition changes at the substrate surface or the process chamber. For example, the substrate may include a trench that may be get deeper with successive treatments and may warrant process changes to account for the deeper trench. However, process changes may not be exclusive to geometry and/or composition changes, such as, but not limited to, plasma chamber conditioning.

In one embodiment, the plasma chamber may receive a substrate on a substrate holder in a plasma process chamber. The substrate may include a mask layer that exposes portions of the substrate that may be subjected to plasma treatments that may have no or minimal impact on the mask layer. The exposed portions may be exposed to alternating plasma treatments from a first plasma and a second plasma. The plasma treatments may generated by any of the techniques or embodiments disclosed herein. However, one or more process conditions may adjusted during subsequent iterations of the plasma treatments. The gas mixture, power, pressure, or any combination thereof may be different from a similar previous treatment. For example, the subsequent adsorption or desorption process conditions may be different from the previous implementations of the adsorption or the desorption process. For the adsorption In one specific embodiment, the bias power may be adjusted to increasing bias power of the second plasma between at least two of the exposures of the second plasma to the substrate.

In one embodiment, the bias power may be increased during subsequent implementations of the desorption plasma process, the increases may occur with each implementation of the desorption process, but is not required to increase for each instance of the desorption process. In one specific embodiment, the bias power may increase by a difference between 0.5% to 5% the bias power of the at least two exposures of the second plasma. In other embodiments, the exposure time to the plasma treatments may also be increased during subsequent processing.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

Figure 1:
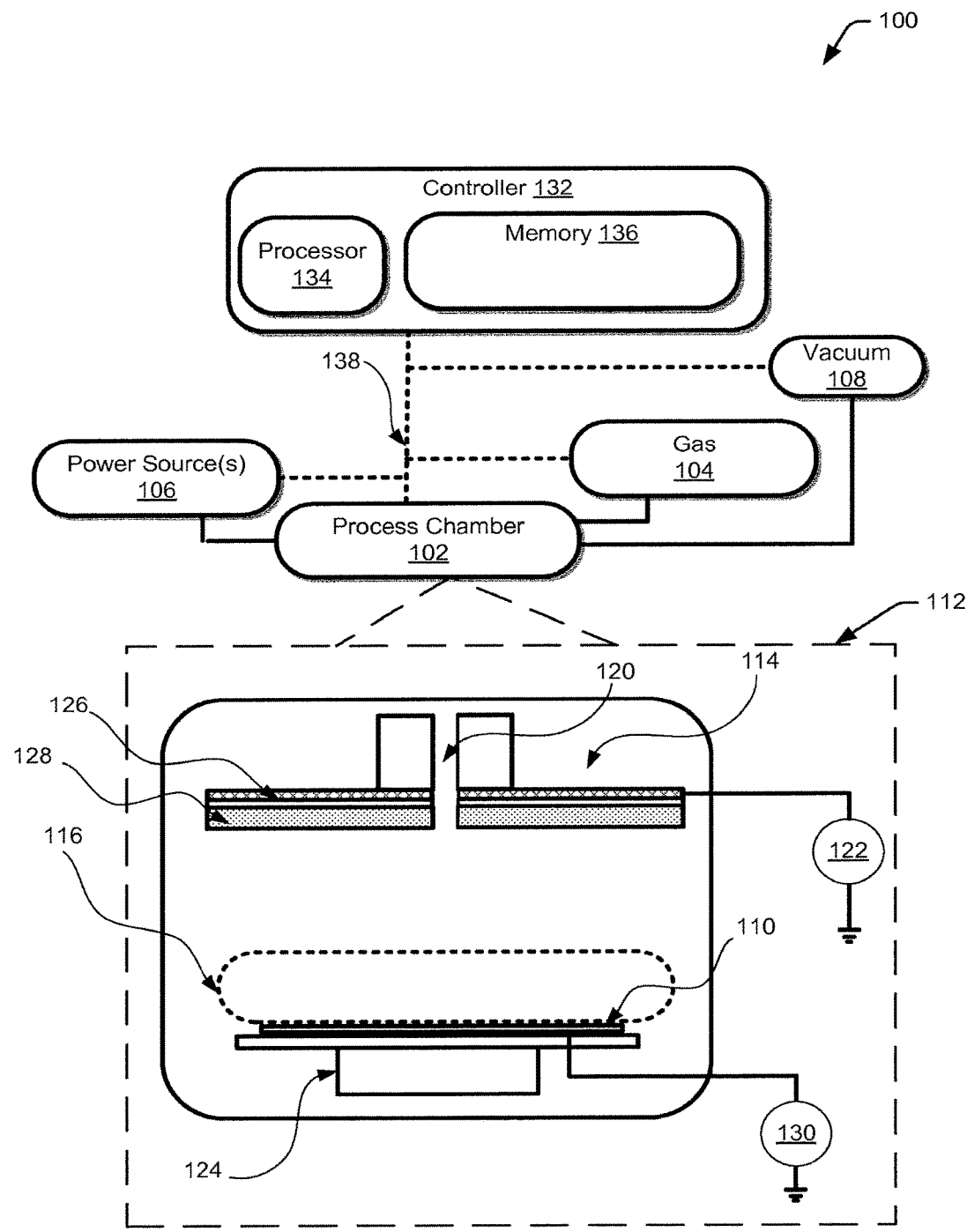
FIG. 1 is an illustration of a representative embodiment of a plasma processing system that shows a schematic cross-sectional illustration of a plasma chamber that may enable the transition between a first plasma and a second plasma to treat a substrate according to at least one embodiment.

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

"Substrate" or "Microelectronic substrate" as used herein generically refers to the object being processed in accordance with the embodiments described herein. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

FIG. 1 depicts a plasma processing system 100 for treating substrates using plasma (not shown) that may be generated in a plasma chamber 102. Plasma may be generated by applying electromagnetic energy (e.g., power sources 106) to a process gas mixture that is provided by a gas delivery system 104 to the plasma chamber 102. The gas delivery system 104 may include mass flow controllers, check valves, and the like to be used control gas mixture distribution. A vacuum system 108 in fluid communication with the plasma chamber 102 may also maintain a sub-atmospheric pressure during plasma generation. The vacuum system 108 may include one or more pumps and control systems (e.g., $N_2$ ballast system, butter-fly valve system) to control the pressure within the plasma chamber 102.

Plasma generation may be done by applying electromagnetic energy to an electrically neutral gas to cause electrons to be released from a gas molecules that are positively charged (e.g., ion) as result of the lost electron. The ions may be characterized as a molecule or atom where the total number of electrons are not equal to the total number of protons resulting in a positive charge. Molecular or atomic radicals (e.g., molecules or atoms with at least one unpaired electron) may also be generated from the electrically neutral gas. Generally, the radicals may have a neutral, positive, or negative charge and may have high chemical reactivity relative to the ions. Over time, the electromagnetic energy and the increasing electron collisions within the gas mixture may increase the density of ionized molecules and radicals within the gas mixture that may be used to treat the substrate 110.

The plasma chamber system 100 may alter certain process conditions to influence the amount of flow of ions and/or radicals towards the substrate, such that the ionized molecules may be influenced by potential differences within the plasma chamber 102. For example, the potential differences within the plasma chamber 102 may direct the ionized molecules (or atoms, or radicals) towards a substrate 110. The ions and radicals may interact with the substrate or treat the substrate through deposition or passivation that alters the surface of the substrate or that may remove a portion of the substrate following the deposition or passivation.

In FIG. 1, the plasma chamber 102 cross section illustration 112 illustrates one embodiment of a power source assembly 114 that enables the transmission of electromagnetic energy (e.g., microwave energy, RF energy) and the gas mixture (not shown) into the region proximate to the substrate 110. The gas mixture may be introduced into the plasma processing region 116 that is proximate to the substrate holder 124, along the gas pathway 120 through the center of the power source assembly 114. In other embodiments, the gas mixture may be introduced from other locations within the plasma chamber 102. The plasma processing region 116 may also receive energy from a first energy source 122 to generate plasma that may be used to treat a substrate 110 disposed on the substrate holder 124. The electromagnetic energy may include electromagnetic energy (e.g., microwave energy @>300 MHz and/or radiofrequency (RF) energy @<300 MHz) that may transmitted, in some way, from the power source 106 to the power source assembly 114. In the FIG. 1 embodiment, the power source assembly 114 may include a microwave waveguide 126 and the dielectric component 128 may be disposed around the gas pathway 118. In other embodiments, the power source assembly 114 may include an antenna plate (not shown) that may be arranged in a way that enables current to flow around the power assembly 114 in a plane that may substantially parallel to the substrate 110. The current may be induced to flow between a RF power source (not shown) and the ground terminal (not shown) along a low impedance path (e.g., metal layer) and generate a magnetic field (not shown) around the low impedance path that may be used to generate plasma in the plasma processing region 116 or generate plasma in a region above 116 and transmit plasma to the plasma processing region 116.

The gas mixture in the plasma processing region 116 may also receive electromagnetic energy from a second source (e.g., bias power source 130) that may bias the substrate holder 124 and influence the plasma characteristics proximate to the substrate 110. In some embodiments, as will be described in greater detail in the description below, the bias power source 130 and the first power source 122 may be operated in unison or alone to generate plasma within the plasma processing region 116. In one embodiment, the bias power source 130 may be an RF power source that may provide more than 50 W of power at 10 MHz or higher. The biasing of the substrate holder 124 and the power assembly 114 may be implemented by using a controller 132 that may coordinate the process sequencing that enables plasma generation within the plasma processing region 116.

The controller 132 may use a computer processor 134 and memory 136 to execute computer-readable instructions that may be provided over an electrical communication network 138 to control the plasma processing system 100 components (e.g., power sources 106, gas delivery 104, etc.). The one or more computer processors 134 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The memory 136 may include one or more computer-readable storage media ("CRSM"). In some embodiments, the one or more memories may include non-transitory media such as random access memory ("RAM"), flash RAM, solid state media, and so forth. Broadly, the controller 132 may control the sequencing of processing events that enable plasma generation or to transition between different types of plasma that may be exposed to the substrate 110.

The plasma processing system 100 may be used to implement several different types of plasma that may be used to etch patterns into or remove portions of the substrate 110 to manufacture electronic devices. As the size and complexity of electronic devices increases, the need for highly selective etch processes that do not damage structures on the substrate 110 has increased. One approach to higher selectivity may include self-limiting layer etch processes that may alternate between precursor deposition steps (e.g., deposition, oxidation, passivation, etc.) and the removal of the precursor layer. In one specific embodiment, the initial surface treatment may be an adsorption process in which an atoms or molecules permeate or diffuse into the surface of the substrate 110. The adsorption process may alter one or more monolayers of the surface of the substrate 110, such that the monolayer(s) are more easily removed or etched away from the substrate 110 during a subsequent process. One exemplary subsequent process, may include a desorption process that may be used to remove monolayer(s) without damaging the underlying substrate 110. The combination or the transition between adsorption and desorption may enable the removal of the monolayer(s) of the substrate 110 in a controlled or highly selective manner. The plasma processing system 100 may implement one or more methods to alternate between adsorption and desorption processes within the plasma chamber 102.

Figure 2:
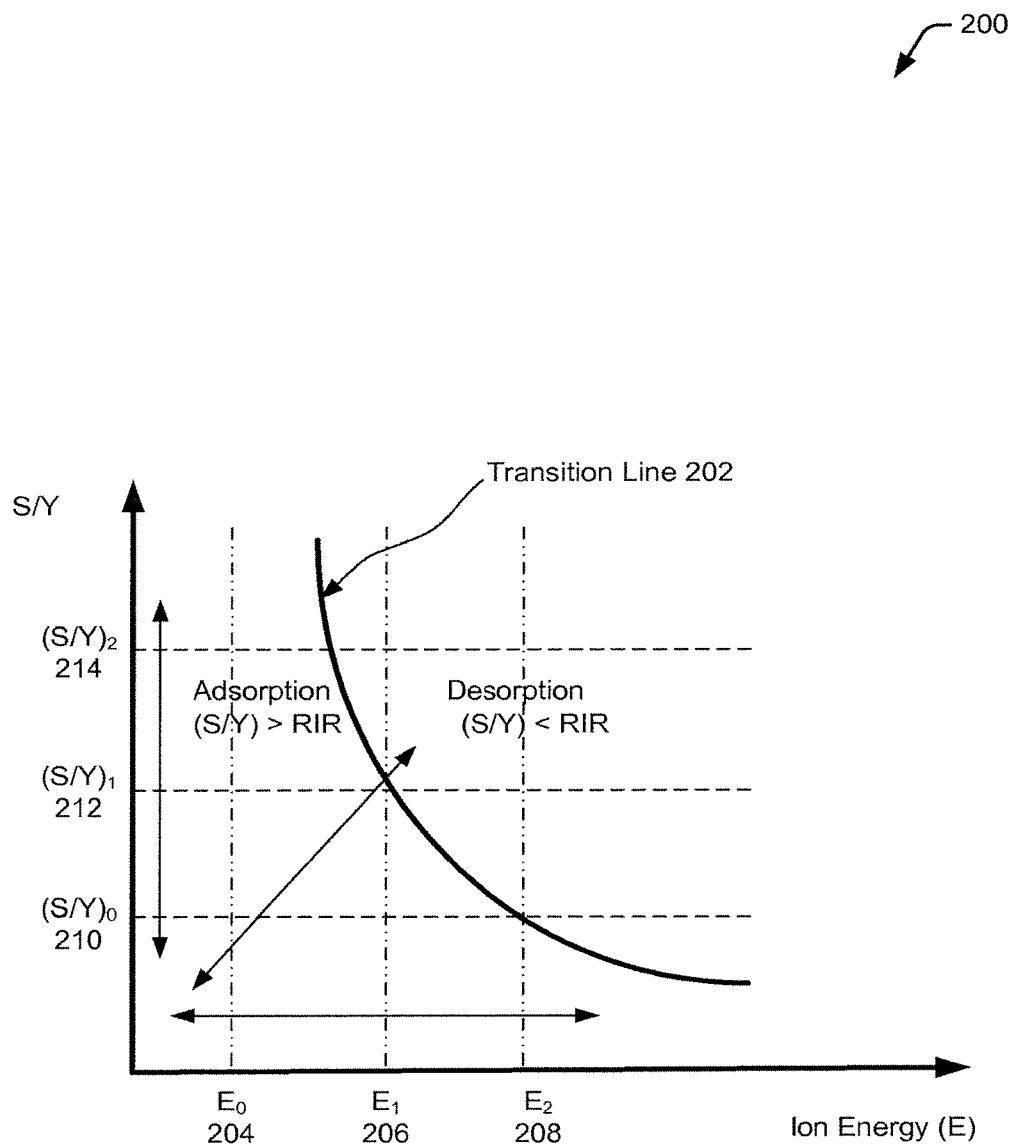
FIG. 2 is a diagram illustrating the transition between the first plasma and the second plasma in view of the ion energy and a sticking coefficient according to at least one embodiment.

FIG. 2 is a diagram 200 illustrating the transition between the adsorption process (e.g., first plasma) and the desorption process (e.g., second plasma) within the context of the ion energy, sticking coefficient(s) of radicals, etch yield(Y), and/or the radical-to-ion flux ratio (RIR) expressed as the ion flux over the radical flux $$\left(\frac{\Gamma_i}{\Gamma_r}\right).$$

FIG. 2 is intended for explanatory purposes and is not intended to provide an all-encompassing model of parameters for monolayer etching. Rather, FIG. 2 is one embodiment that is intended to demonstrate that the transition between adsorption and desorption may be possible by controlling one or more variables related to plasma generation and is one illustration of the relationship of the components (radicals, ions, etc.) of plasma and how they may be varied to treat the substrate to obtain monolayer etching. Ion energy may indicate the amount of energy or density of the ions in the plasma processing region 116 and can be measured using known techniques close to the substrate 110 or in the plasma processing region 116. s may indicate the probability of the atoms or molecules within plasma that may stick or be adsorbed into the substrate 110. s may be a function of ion energy, radical flux, surface temperature, pressure, and surface conditions. s may also be quantified by the rate of adsorption per unit area of the substrate 110 over the collision frequency per unit of area of the substrate 110. In one embodiment, s may be represented as fraction that may be less than or equal to unity (e.g., 0.001-1), with the highest adsorption rate being unity. For example, s may be near 1 when the RIR is very large and the substrate 110 surface is pristine (e.g., clean, low surface roughness). In one embodiment, s may range between 0.1-0.5 during the adsorption process that may alter the etch selectively of the surface relative to the underlying substrate 110. Accordingly, s may be lower, but is not required to be lower, during the desorption process. Y may be an indication of plasma etch rate efficiency by approximating the number of atoms removed per ion that collides with the substrate 110 may range from <1 to an order 10 depending on the ion energy and the layer that is being removed from the substrate 110.

The ratio of $$\frac{S}{Y}$$

may indicate the probability of whether ions and radicals are adsorbing to the substrate 110 or removing portions of the substrate 110. A higher $$\frac{S}{Y}$$

value may indicate adsorption is more likely occurring while a lower $$\frac{S}{Y}$$

value may indicate that desorption is more likely occurring. In some embodiments, when is s is large (e.g., adsorption) then Y may likely be relatively low indicating that radical flux may be higher than the ion flux within the plasma processing region 116. Hence, deposition or passivation of the substrate 110 may occur to at least alter the surface of the substrate 110 to make it different from the underlying substrate 110 with respect etch selectivity. In contrast, in one embodiment, when s is relatively low (e.g., desorption) then Y may likely be relatively high indicating that the ion flux may be higher than the radical flux within the plasma processing region 116. However, in another embodiment, s may be relatively high (e.g., >0.5) during some desorption processes, however adsorption effects may be minimized due to Y being much higher during the desorption process. In short, the desorption rate may be much higher than any adsorption (e.g., low radical flux) that may be occurring in this embodiment.

In FIG. 2, the transition line 202 indicates where plasma may transition between adsorption and desorption characteristics. In this embodiment, the transition may be described as a function of, but is not limited to, the ion energy proximate to the substrate 100 surface, the sticking coefficient(s) of the radicals, the etch yield(Y) or atoms removed per ion, and RIR. For example, to the left of the transition line 202, plasma is more likely to exhibit adsorption characteristics, such that deposition or passivation may occur at the substrate 110 surface. To the right of the transition line 202, plasma is more likely to remove portions of the substrate 100. Accordingly, the ion energy may be an important factor in controlling the transition between adsorption and desorption and plasma performance within each of the process regions. However, ion energy is not the sole determining factor governing the transition between adsorption plasma and desorption plasma.

In one embodiment, plasma may be described as a combination of radicals and ions interacting with each other and the substrate 110 that may be controlled to achieve a desired result on the substrate 100 surface. For example, the adsorption process may be characterized by what is added to or formed on the surface that increases the etch selectivity of the surface relative to the underlying substrate 110. During the adsorption process, surface coverage by the radicals may be more important than atom removal by energetic ions. Hence, a lower ion energy may be more desirable during with a higher values of $$\frac{S}{Y},$$

as suggested by the transition line 202 in FIG. 2. The $$RIR\left(\frac{\Gamma_r}{\Gamma_i}\right)$$

may also be relatively higher since a higher radical flux ($\Gamma_r$) may be more desirable to obtain more surface coverage in a shorter amount of time. Hence, within the adsorption regime, $$\frac{S}{Y}$$

may be greater than RIR. However, during the desorption process the removal of the surface layer may be a higher priority than surface coverage. Accordingly, it may be desirable to have higher ion energy making the energetic ions more likely to remove surface atoms from the substrate 110. As the ion energy increases, the ion flux ($\Gamma_i$), the RIR, and Y may increase, indicating that the removal of one or more monolayers from the substrate 110 is more likely occurring. As shown in FIG. 2, the adsorption regime (e.g., to the left of the transition line 202) is more likely to exist when $$\frac{S}{Y}$$

is greater than RIR. Likewise, the desorption regime, to the right of the transition line 202, is more likely to exist when $$\frac{S}{Y}$$

is less than RIR. However, in the desorption regime may have little or no radicals present depending on the process gas mixture. Regardless, the ion flux, during desorption, may be higher than the ion flux during adsorption. It may be possible to transition between the two regimes in a variety of ways.

FIG. 2 illustrates several potential embodiments relating ion and $$\frac{S}{Y}$$

how it may be possible to transition between adsorption and desorption and where the process margin between adsorption and desorption may be large or small. For example, under the ion energy $E_0$ 204 embodiment, the ion energy may be low enough to allow a wider adsorption process margin that maintains the adsorption regime over a broader variation of $$\frac{s}{Y}$$

from $(s/Y)_0$ 210 up to $(s/Y)_3$ 214. The $$\frac{s}{Y}$$

process margin becomes narrower as the ion energy $E_1$ 206 increases towards ion energy $E_3$ 208, such that desorption may be more likely to occur depending, at least in part, on $$\frac{s}{Y}$$

and RIR. For example, at $(s/Y)_0$ 210 the adsorption regime may dominate when the ion energy is $E_1$ 206 and the RIR may be less than $(s/Y)_0$ 210. However, if the RIR increases to greater than $(s/Y)_0$ 210, then desorption may be more likely to occur and it may be possible to be in the desorption regime with ion energy $E_1$ 206. However, in other embodiments, distinguishing between adsorption and desorption may become more difficult to determine or may have lower adsorption or desorption rates when the process is closer to the transition line 202.

While operating at ion energy $E_2$ 208, it may be more difficult to insure the plasma is consistently operating strictly in the adsorption or desorption regime when $$\frac{s}{Y}$$

is approximately $(s/Y)_0$ 210 or that the adsorption/desorption rates may be slower proximate to the transition line 202. It may not be desirable, but may be possible, to operate under this condition because adsorption/desorption process margin difference is much lower than for other possible conditions. A similar process margin issue may exist at the ion energy $E_1$ 206 and $(s/Y)$ 212 embodiment. Ideally, the preferred process may be further away from the transition line 202 than shown under the two previous embodiments. For example, in the $(s/Y)_1$ 212 embodiment, the adsorption process margin may be increased by lowering the ion energy $E_1$ 206 towards ion energy $E_0$ 204 or by decreasing the RIR. In contrast, the desorption process margin may be increased by increasing ion energy $E_1$ 206 towards ion energy $E_2$ 208 or by increasing the ion flux.

Although ion energy and $$\frac{s}{Y}$$

provide a strong indication of whether plasma may be operating within the adsorption or desorption regime, they are not solely determinative and may be influenced by other variables (e.g., RIR) that will be described in the description of FIG. 3.

Figure 3:
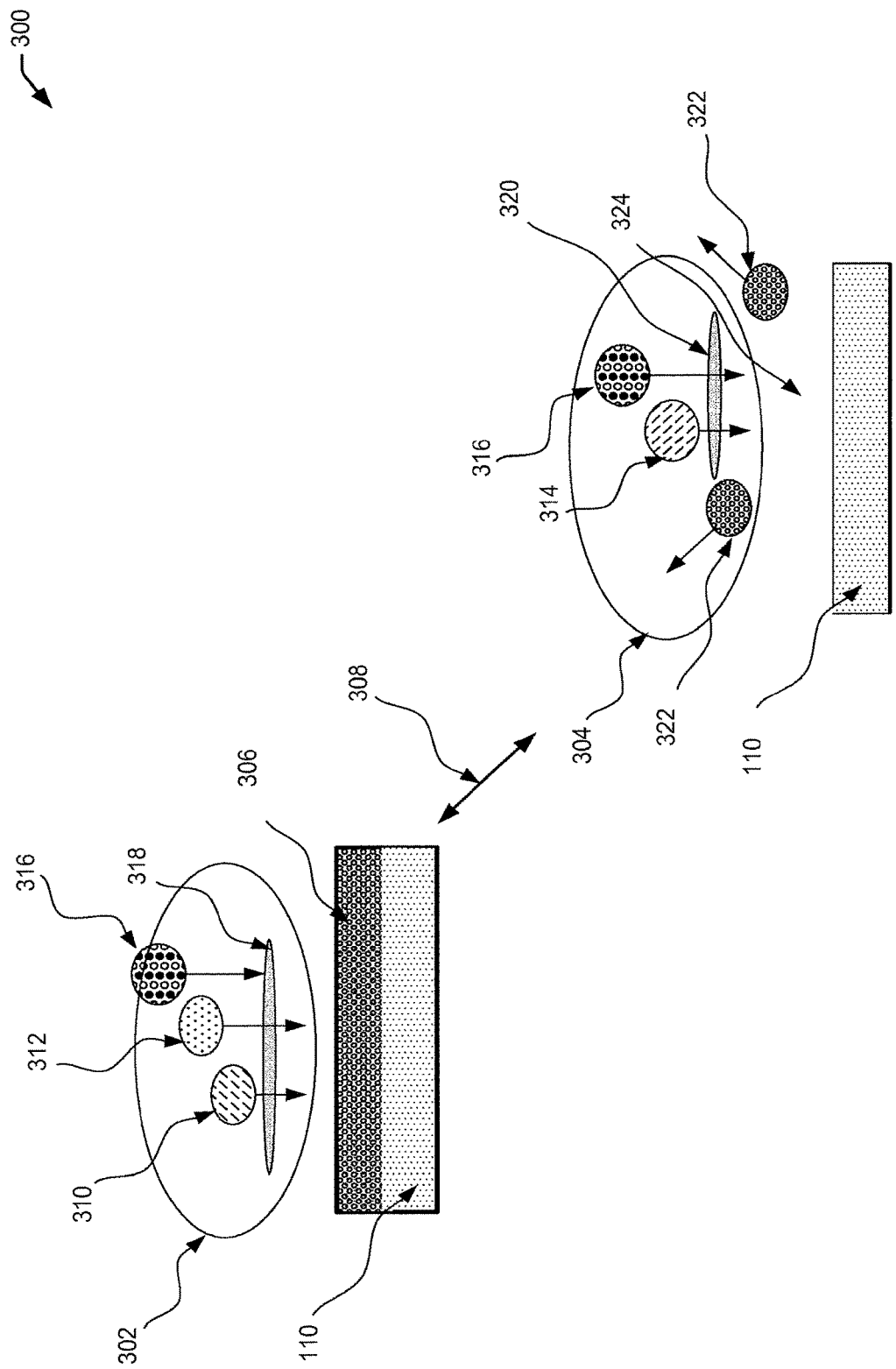
FIG. 3 is an illustration of a representative embodiment of the first plasma and the corresponding substrate treatment and of the second plasma and the corresponding substrate treatment.

FIG. 3 is an illustration of a representative embodiment 300 of a first plasma 302 (e.g., adsorption) treating the substrate 110 and a second plasma 304 (e.g., desorption) treating the substrate 110. The plasma processing system 100 may implement one or more methods to transition between the first plasma 302 and the second plasma 304, as illustrated by the double-headed arrow 308. The first plasma 302 may be used to form an adsorbed layer 306 on the substrate 110 and the second plasma 304 may be used to remove the adsorbed layer 306 and expose the underlying substrate 110. In addition to the parameters illustrated in FIG. 2, RIR or ion flux may play a role in determining what type of plasma is exposed to the substrate 110. The formation of the ions and radicals will be briefly described below along with a brief explanation of flux.

As noted in the description of FIG. 1, the plasma processing system 100 may apply electromagnetic energy to the gas mixture within the plasma chamber 102 to generate the first plasma 302 and/or the second plasma 304. The gas mixture may include reactants gases, dilution gas, or a combination thereof. The reactant gases may be more likely to generate ions and radicals and the dilution gas(es) may be more likely to form ions than radicals, if at all. However, when the gas mixture includes both types of gases there may be a combination of ions and radicals from different gases. The plasma processing system 100 may optimize various process conditions to control ions and/or radicals used to treat the substrate 110.

In the adsorption embodiments, the gas mixture may include reactant gas or a combination of reactant gas(es) and dilution gas(es). The reactant gas may include, but is not limited to, oxygen-containing gas, nitrogen-containing gas, hydrogen containing gas, carbon containing gas, a halogen-containing gas, or any combination thereof. The dilution gas(es) (e.g., argon, helium, etc.) may include a chemically inert species relative to gases or materials within the plasma chamber 102. The gas mixture may vary between 100% reactant gas(es) by volume down to 10% by volume for the adsorption embodiments. In one specific embodiment, the gas mixture may include between 80%-100% by volume of the reactant gases (e.g., $Cl_2$, with the remainder being one or more dilution gases.

In one adsorption embodiment, the first plasma 302 may include adsorbing radicals 310 and adsorbing ions 312 that may generated by exposing the gas mixture to electromagnetic energy. In the combination gas mixture embodiment, the first plasma 302 may also include dilution ions 314. Ideally, the radical flux towards the substrate 110 will dominate the ion flux and enable the formation of the adsorbed layer 306 on the substrate 110. In one embodiment, the adsorbed layer 306 may include a composition of the atoms and/or molecules from the gas mixture and the substrate 110 (e.g., Si). Following the formation of the adsorbed layer 306, the plasma processing system 100 may transition to the second plasma 304 to etch the adsorbed layer 306 and expose the underlying substrate 110. In the desorption embodiments, the second plasma 304 may include desorbing ions 316 and may or may not include desorbing radicals 314. For example, when the gas mixture includes only dilution gas(es), then the desorbing radicals 314 may not be present. However, radicals may be present when reactant gas is present in the plasma chamber 102 during the desorption process. But, the ion flux may be much higher than the radical flux, therefore the desorption process may dominate adsorption effects at the substrate 110.

Although both plasmas may include ions and/or radicals, they may be used for different purposes depending on the whether being used for adsorption or desorption. For example, the ion energy during adsorption may be less than 20 eV, while the ion energy during desorption may be greater than 20 eV. Further, the adsorbing RIR may be higher than the desorbing RIR due to the desorbing plasma having few, if any, radicals or radical flux ($\Gamma_r$). For example, having a very small radical flux or near zero radical flux would make the desorbing RIR very low. The RIR values may be measured in the plasma processing region 116 proximate to the substrate 110 using the flux surface areas (e.g., adsorption surface area 318 or desorption surface area 320) that may be near the center of the substrate 110 and proximate to the substrate 110 surface.

Broadly, flux may be considered the flow rate of ions or radicals as they move through a flux surface area and have the units of a physical property per unit of area. Ion flux ($\Gamma_i$) and radical flux ($\Gamma_r$) may have the units of atoms/cm$^2$ and may represent the quantity or concentration of ions or radicals that cross the adsorption surface area 318 or desorption surface area 320 and may collide with the substrate 110. The ions and radicals may be attracted to the substrate 110 depending on the potential difference between the plasma and the substrate, energy, charge, process pressure, process temperature, or any combination thereof.

In one adsorption embodiment, the process gas mixture may include a reactant gas (e.g., halogen, oxygen) and a dilution gas (e.g., argon, helium, or combination thereof). The adsorption radicals 310 may be used to form the adsorbed layer 306 via deposition or passivation. Ideally, the $\Gamma_r$ may be higher than the $\Gamma_i$ to enable the adsorption rate to be higher than the desorption rate at the substrate 110. The radical flux ($\Gamma_r$) and/or ion flux ($\Gamma_i$) may be measured near or at the center of the substrate 110 $\Gamma_i$ and proximate (e.g., <10 mm) to the surface of the substrate 110 using any known technique to measure $\Gamma_r$ or $\Gamma_i$. Examples of the known techniques, may include, but are not limited to, adsorption probes, Langmuir probe, hairpin probes, a retarding field energy analyzer, optical emission spectroscopy, actinometry, mass spectroscopy, or any combination thereof.

The first plasma 302 may be generated to minimize the ion energy of the adsorption ions 312 to minimize etching of the substrate 110 relative to the adsorption of the adsorbed radicals 310. In short, the adsorbed layer 306 may be generated when the adsorption rate is greater than the desorption rate at the substrate's 110 surface. The adsorbed layer 306 may be formed when the adsorbed radical 310 energy is less than the nominal bond enthalpy of the gas mixture constituent and the silicon substrate 110. In one specific embodiment, the substrate 110 may include a bulk silicon substrate 110 that may provide the starting material for the generation of the adsorbed layer 306. The first plasma 302 may include a halogen-containing gas (e.g., $Cl_x$, $F_x$) or an oxygen-containing gas (e.g., $O_x$) that generates the adsorbed radicals 310 that may react with the silicon surface through known deposition, passivation, or oxidation techniques.

In another specific embodiment, the substrate 110 may include a patterned structure (not shown) that may include sidewalls or trenches that protrude from or into the substrate 110. The adsorption process may tuned to form the adsorbed layer 306 selectively within the trench, such that the adsorption rate at the bottom of the trench may be higher than the adsorption rate on the sidewalls. The adsorbed layer 306 may also be conformally formed on the structure protruding from or into the substrate 110 using the first plasma 302. Adsorption methods will be discussed in greater detail in the descriptions of FIGS. 4 and 5.

Following the adsorption process, the plasma processing system 100 may transition to a desorption process as described in the description of FIG. 2. The desorption process may selectively remove the adsorbed layer 306 from the substrate 110. The desorption ions 316 may be used to remove or etch the adsorbed layer 306 to form a desorbed region 324 formed by the removal of the desorbed molecules/atoms 322 from the substrate 110. In other words, the adsorbed layer 306 may be removed to expose the underlying substrate 110 surface. Ideally, the $\Gamma_i$ may be higher than the $\Gamma_r$ to enable the desorption rate to be higher than the adsorption rate at the substrate 110. The radical flux ($\Gamma_r$) and/or ion flux ($\Gamma_i$) may be measured near or at the center of the substrate 110 $\Gamma_i$ and proximate (e.g., <10 mm) to the surface of the substrate 110 using any known technique to measure $\Gamma_r$ or $\Gamma_i$ may be used.

In the desorption embodiments, the second plasma 304 may have a higher $\Gamma_i$ relative to the $\Gamma_r$ or may not have any radicals, such that the desorption rate is higher than the adsorption rate at the substrate 110. Obtaining a higher $\Gamma_i$ may include varying the process conditions, such as, but not limited to, the gas mixture, electromagnetic energy, pressure, or combination thereof. However, all the process conditions are not required to change for the transition between adsorption and desorption to occur. Desorption methods will be discussed in greater detail in the descriptions of FIGS. 4 and 5.

Figure 4:
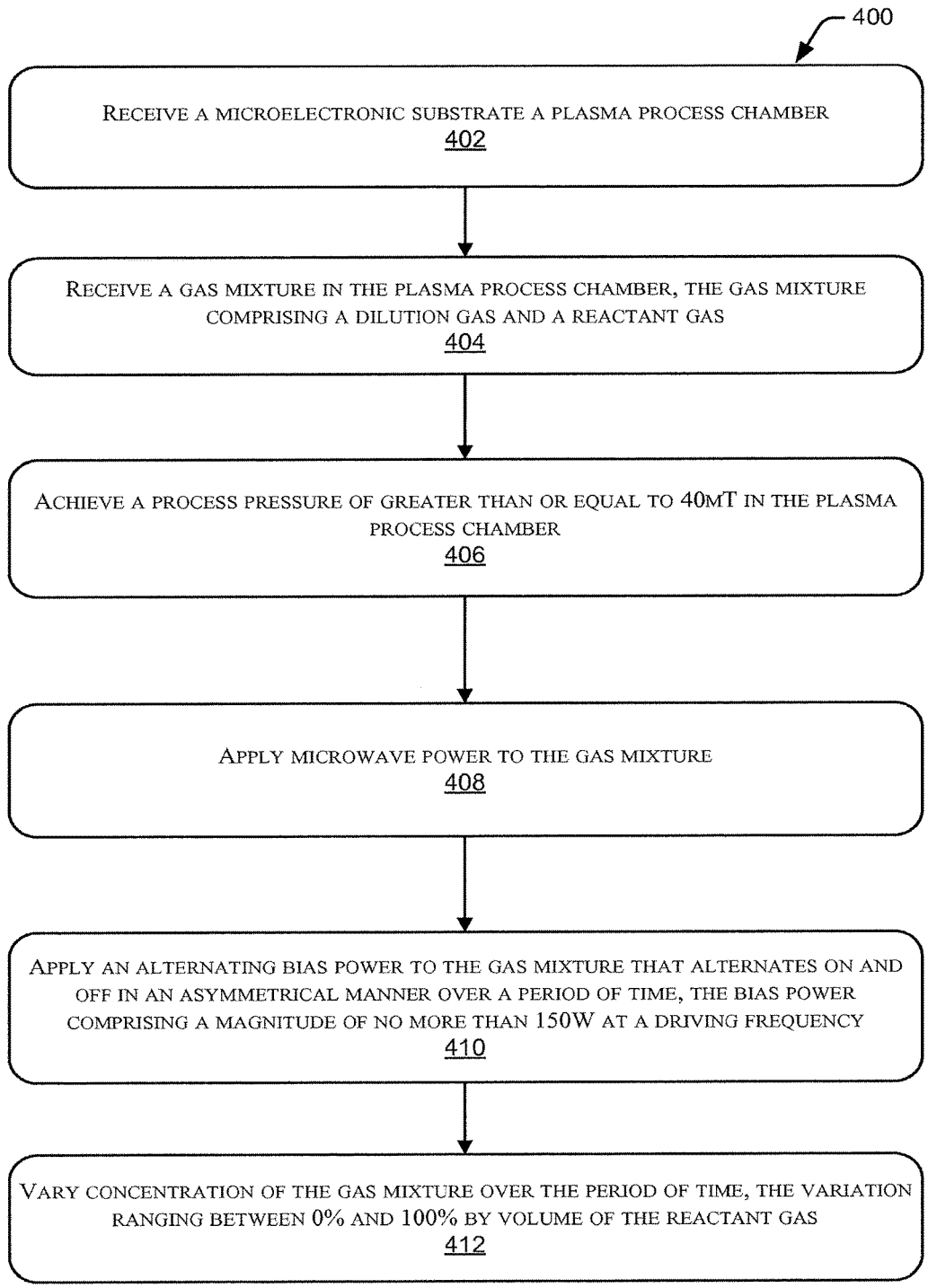
FIG. 4 is a flow diagram for a method for generating a first plasma and a second plasma to treat a substrate according to at least one embodiment.
Figure 5:
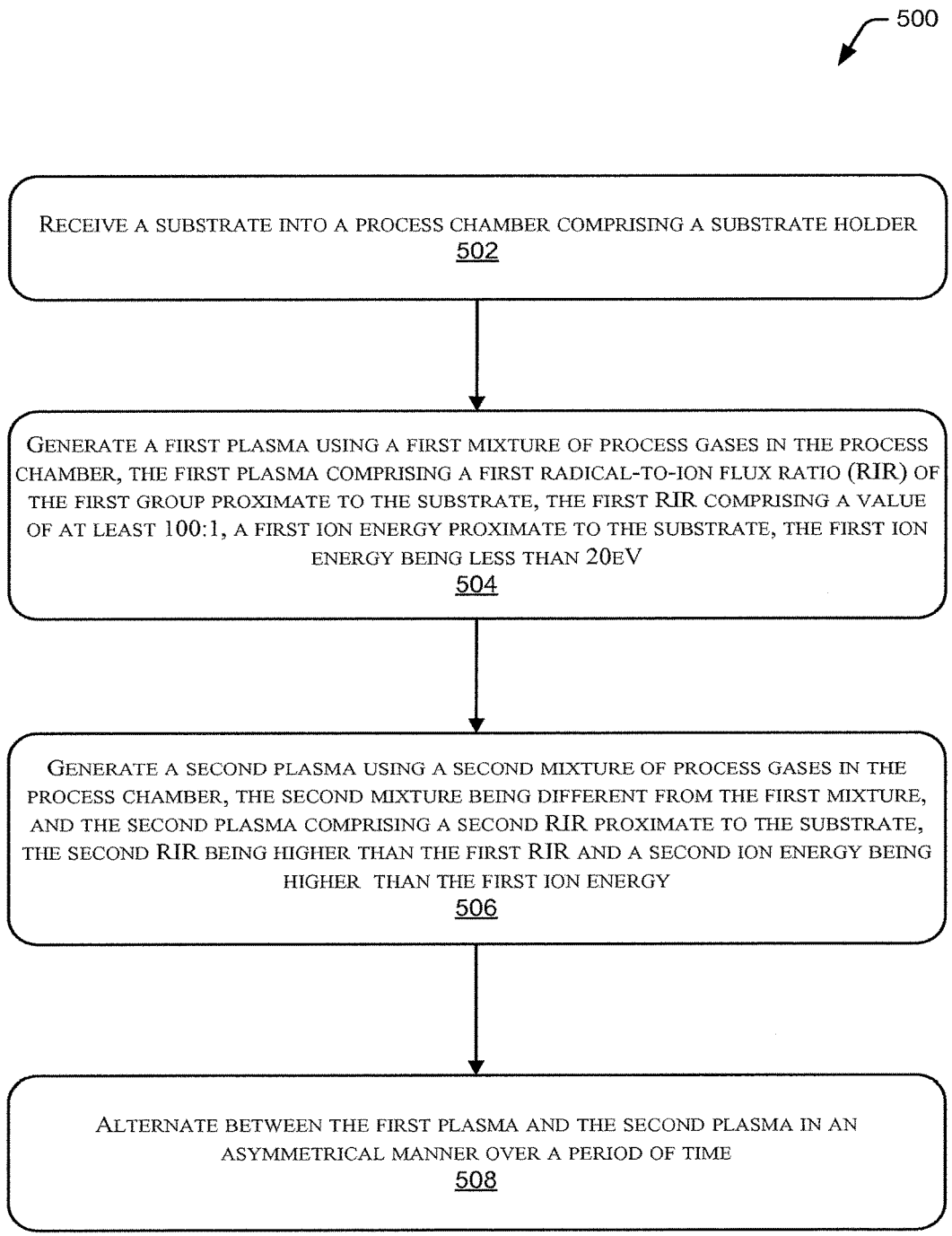
FIG. 5 is a flow diagram for another method for generating a first plasma and a second plasma to treat a substrate according to at least one embodiment.

FIGS. 4 & 5 illustrate methods for removing surface layers of a substrate 110 using an iterative process using the plasma processing system 100 that alternates between an adsorption plasma (e.g., first plasma 302) and a desorption plasma (e.g., second plasma 304). The plasma processing system 110 may control the radical flux ($\Gamma_r$) and/or ion flux ($\Gamma_i$) to transition between adsorption and desorption.

In one approach, the adsorption processes may be enabled by a combination of relatively high pressure and high source power (e.g., power to the power assembly 114) that may generate radicals from the gas mixture and produce a higher $\Gamma_r$ that results in a higher surface coverage of the substrate 110 (e.g., adsorbed layer 306). These process conditions may also decrease the first plasma 302 potential to minimize the ion energy or $\Gamma_r$ to prevent desorption during the formation of the adsorbed layer 306. The high pressure/power combination may be able to keep ion energy low, but generate enough radicals to have the adsorption process dominate any desorption effects. Interestingly, all high power techniques may not be equal with respect to ion energy control. It may be advantageous to use microwave power at power assembly 114, rather than RF power. It has been observed that the efficiency of the electron generation from a microwave source is much better than using an RF power source. For example, the efficiency of the electron generation from the microwave wave or surface wave source is so good at high frequency that the mean electron energy determined by the particle balance (source and loss) in the plasma is lower for the microwave embodiment than RF sources driven at much lower frequencies (e.g., <300 MHz). The microwave embodiment may enable a higher current to the substrate 110 which enables a lower peak to peak voltage (Vpp) at the substrate when compared to RF sources (e.g., ICP, CCP techniques) with the same or similar applied power. Being able to access very low electron temperature (Te) and very low Vpp simultaneously with large ion current is a unique property of microwave sources that affords a unique space high precision etching processes. In this way, microwave sources may enable lower ion energy for the same applied power by RF power sources. Accordingly, similar power profiles between different types of power sources (e.g., microwave or RF) may be distinguishable per the differences in driving frequency, ion energy, or a combination thereof.

The adsorption process may form a thin (e.g., monolayers) adsorbed layer 306 on the substrate 110 by saturating the surface with halogen atoms/molecules or with oxygen atoms/molecules. The adsorbed layer 306 may have a relatively higher degree of etch selectivity compared to the underlying substrate 110, such that the adsorbed layer 306 may have a higher etch rate than the substrate 110. Accordingly, a desorption process may be used to remove the adsorbed layer while minimizing the damage to the underlying substrate 110. The desorption process may include transitioning the ion energy, pressure, gas mixture, or combinations thereof of the first plasma 302 to enable the desorbed ions 316 to etch the adsorbed layer 306.

In one approach, the desorption processes may be enabled by a combination of different power sources applying electromagnetic energy to the gas mixture to generate the second plasma 304. The additional electromagnetic energy may generate a higher ion energy in the second plasma 302 compared to the ion energy of the first plasma 302. The change in ion energy may not be exclusive to the combination of power sources. The desorption process may also be optimized by making changes to the gas mixture and pressure to adjust the etch rate or etch profile on the substrate 110. Generally, the desorption process may have a higher $\Gamma_i$ compared to the adsorption process and a much lower $\Gamma_r$ or near zero $\Gamma_r$ when the desorption gas mixture may not include reactant gases. The desorption process may be self-limiting due to the etch selectivity between the adsorbed layer 306 and the substrate 110. Following the adsorbed layer 306 removal, the second plasma 304 (e.g., desorption) may be transitioned back to the first plasma 302 (e.g., adsorption) and begin the adsorption and desorption process again. This transition between adsorption and desorption may be iterated until a desired portion of the substrate 110 has been removed. Turning to FIG. 4, the method 400 illustrates one embodiment of the adsorption/desorption process described above.

At block 402, the plasma process chamber 102 may receive a microelectronic substrate 110 which may include any type of semiconductor substrate that may include patterned features or elements that may be used to form microelectronic devices. The semiconductor substrate may include, but are not limited to, any single element substrates (e.g., Si), silicon on insulator substrates, III-V substrates, or epitaxial silicon substrates. The substrate 110 may be placed on the substrate holder 124 that may disposed between the power assembly 114 and a bias electrode that may be disposed in the substrate holder 124.

At block 404, the gas delivery system 104 may provide a gas mixture to the plasma chamber 102. The gas mixture may include at least one reactant gas, dilution gas(es), or a combination thereof that may be used to form an adsorbed layer 306 on the substrate 110. The reactant gas may include at least one chemical element that reacts with the substrate 110 or films on the substrate 110. In one embodiment, the reactant gas may include, but is not limited to, a halogen-containing gas (e.g., $Cl_x$, $F_x$) or an oxygen-containing gas (e.g., $O_x$). In another embodiment, the gas mixture may also include a dilution gas(es) with the reactant gas. The dilution gas may include, but is not limited to, argon, helium, nitrogen, or any combination thereof. In one specific embodiment, the gas delivery system 104 may provide a gas mixture that comprises between 10%-100% by volume of a reactant gas with the remainder being a dilution gas(es). In one specific embodiment, the adsorption process gas mixture may include 80%-100% reactant gas(es) with the remainder being dilution gas(es).

At block 406, the vacuum system 108 may be used to achieve a process pressure of greater than or equal to 40 mTorr in the plasma process chamber 102 to facilitate the initial adsorption process. The controller 132 may optimize the gas flow and the pumping speed to obtain a relatively stable pressure within the process chamber 102. The pressure may range up to 500 mTorr depending on the substrate 110 composition and the desired adsorption rate for the adsorbed layer 306. Also, the chamber pressure may vary based on the transition between the adsorption and desorption process. The transition will be described in greater detail below. However, in one specific embodiment, the process chamber 102 pressure may be about 80 mTorr during the initial adsorption process. However, the pressure may vary depending on the desired flux conditions and ion energy during the adsorption process. In one embodiment, the process pressure may also change during the adsorption process to adjust the surface coverage of the substrate 110 with the adsorption layer 306. For example, the initial pressure may be at least 40 mTorr and may transition to a higher pressure during the adsorption process. The adsorption process may also include increasing the radical flux towards the substrate 110 using a combination of pressure and applied energy to the gas mixture.

At block 408, the first power source 124 may apply microwave power to the gas mixture through the power assembly 114 disposed in the process chamber 102. The microwave power may range between 500 W and 10,000 W and have a driving frequency of at least 300 MHz up to 10 GHz. In one specific embodiment, the driving frequency may be about 2.45 GHz for any power setting between 500 W and 10,000 W. Ideally, the applied microwave power and driving frequency should enable the generation of the first plasma 302, such that the ion energy within the plasma processing region 116 may be less than 20 eV and that radical flux is higher than the ion flux proximate to the substrate 110 or at least within the plasma processing region 116.

In another embodiment, the applied microwave power may range between 500 W and 3000 W with a driving frequency between 1 GHz and 10 GHz. The applied power in combination with the gas mixture and pressure embodiments described herein may enable an ion energy of less than 20 eV in the first plasma 302. In other embodiments, the power and driving frequency may be optimized to target specific ion energy thresholds, like <5 eV, <10 eV, or ranging between 5 eV and 15 eV. In one specific embodiment, the microwave power may be about 2000 W at a driving frequency of about 2.45 GHz.

The first plasma 302 process time may vary depending on the process conditions and the substrate 110 composition and the adsorbed layer 306 composition. The adsorption time may vary between 100 ms and 3000 ms. Ideally, a shorter adsorption time of less than 1000 ms may desirable for process cycle time considerations. However, in most embodiments at or above the 40 mTorr threshold may include a process time of less than 500 ms.

Forming the adsorption layer 306 may include any molecular or atomic composition in view of the substrate 110 composition (e.g., Si) and the reactant gas (e.g., $Cl_x$, $F_x$, $O_x$), such that the etch selectivity between the adsorbed layer 306 and the substrate 110 may be leveraged to remove the adsorbed layer 306 during a subsequent desorption process with minimal damage or alteration to the substrate 110. Transitioning to the desorption process may be done in a variety of ways, however one set of the desorption embodiments may at least include applying additional electromagnetic energy to the gas mixture.

At block 410, the bias power source 130 may apply a bias power to the gas mixture proximate to the plasma processing region 116 or to the substrate 110. The bias power may transition the plasma chamber 102 to a desorption process that may remove the adsorbed layer 306, as shown in FIG. 3. However, in other embodiments, the gas mixture, pressure, source power (e.g., first power source 122), or combination thereof may vary before, during, or after the application of the bias power to the gas mixture (see additional details in the description of block 412). For example, in higher pressure (e.g., >150 mTorr) and higher source power (e.g., >2000 W) embodiments the bias power may increase up to 200 W with a driving frequency of about 27 MHz. However, in most embodiments, the bias power may be no more than 150 W with a driving frequency of no more than 60 MHz, or more particularly at a driving frequency of 13.56 MHz. In one specific embodiment, the pressure may be at about 40 mTorr and the bias power may be between 50 W and 70 W. In one high pressure embodiment, the pressure may be about 150 mTorr and the bias power may be about 150 W.

The power and pressure combinations may also be optimized to increase the ion energy from the adsorption process (e.g., first plasma 302) to the desorption process (e.g., second plasma 304). For example, the desorption process ion energy may be greater than 20 eV may have a higher ion flux towards the substrate 110 than during the adsorption process. In more specific desorption embodiment, the ion energy may range from 40 eV up to 70 eV, but should likely remain below a sputter threshold to prevent damage to or contamination of the substrate 110 from undesirable elements.

The timing of the bias power application can applied in an alternating asymmetrical manner, in which the adsorption process may be implemented when the bias power is turned off and the desorption process may be implemented when the bias power is turned on. Broadly, the bias on step may range between 300 ms and 5000 ms with a bias off time ranging between 100 ms and 3000 ms, such that the period of time may range between 400 ms and 8000 ms. For example, in one embodiment, the period of time may be less than 1000 ms with the bias off time being 500 ms or less and the bias on time being less than 500 ms. In one specific embodiment, the period of time may be about 500 ms, with the bias off time being about 100 ms and the bias on time being about 400 ms. In another specific embodiment, the bias off time may be about 450 ms and the bias on time being 100 ms.

In some embodiments, there may be transition times between the bias off and bias on time that may be used to purge the plasma chamber 102 and to re-introduce another gas mixture or to vary the gas mixture without completely purging the gas mixture from the plasma chamber 102. In one specific embodiment, purging the gas mixture between the adsorption and desorption may be less than 4 s of continuous vacuum with no gas mixture being flowed into the process chamber 102. In other purging embodiments, the process gas mixture may be purged by flowing dilution gas and achieved a chamber 102 pressure that may be less than the plasma process pressure.

At block 412, the transition between the first plasma 302 and the second plasma 304 may be enabled by varying the concentration of the gas mixture over the period of time when the bias power is cycled off and on and off. The gas mixture may include a reactant gas and dilution gas during the first plasma 302 process as described above in the description of FIGS. 1-3. The transition to the second plasma may include changing reactant gas concentration by volume to a concentration that was different from the first plasma 302 reactant gas concentration. The reactant gas concentration may vary between 0% and 100% by volume between the adsorption and desorption processes. More particularly, the reactant gas concentration by volume may range between 10% to 100% with the remainder of the gas mixture comprising a dilution gas(es) (e.g., Ar, He, etc., or combination thereof).

In one specific embodiment, the transition between gas mixture may include varying the gas mixture in-situ by changing the incoming flows of the gases, such that gas mixture may not be entirely purged from the plasma chamber 102, but that the gas mixture concentration has transitioned from an adsorption process condition to a desorption process condition. For example, the adsorption process condition may include gas mixture comprising a reactant gas mixture concentration of greater than 10% by volume. The controller 132 may alter the gas flow from the gas delivery system 104 to change decrease the reactant gas mixture concentration to be less than 10% by volume for the desorption process. In some embodiments, the controller 132 may also vary the chamber pressure and/or the first source power 122 between the adsorption process (e.g., first plasma 302) and the desorption process (e.g. second plasma 304). For example, the adsorption process may include a chamber pressure of at least 40 mTorr and the controller 132 may adjust the gas flow rates or pumping conductance to alter the chamber pressure to a desorption process pressure that differs from the adsorption process pressure by at least 10%.

In another embodiment, the gas mixture may have the same or similar gas mixture concentrations (by volume) during the adsorption and the desorption processes. For example, the reactant gas(es) and the dilution gas(es) may be have the same concentration between the adsorption process and the desorption process, such that the gas mixture concentration may be within 20% by volume between the two process steps. When the gas mixture for the adsorption and desorption process may be the same or similar, the source power (e.g., power to the power assembly 114) may be increased and the pressure may be decreased to transition between adsorption and desorption at the surface of the substrate 10.

In another embodiment, the distinction between or change between the first plasma 302 and the second plasma 304 may be a continuous plasma, in that the first plasma 302 may not be extinguished during the transition to the second plasma 304. The controller 132 may vary the gas mixture, pressure, power, or combination thereof to maintain a plasma state within the process chamber 102 during the transition between adsorption and desorption or desorption to adsorption. However, in other embodiments, the first plasma 302 may be extinguished (e.g., no applied power to the gas mixture) and the adsorption gas mixture may be purged prior to introducing the desorption gas mixture or to applying power to the desorption gas mixture. In one specific instance, the purge time may be less than 4 s, such that the purge time may be measured from the extinguishing of the first plasma 302 to the introduction of the desorption gas mixture in the plasma chamber 102. However, in certain embodiments, the purge time may be measured between the extinguishing of the first plasma 302 and the initiation of the second plasma 304.

In another embodiment, purge times may or may include transient conditions within the power supplies 106 that provide electromagnetic energy to the gas mixture. The transient conditions may include power spikes when the power supplies 106 may be turned on or off or when the applied power may be transitioned between different setpoints without being turned off. Any transient issues (e.g., overshoot, undershoot, or stabilization times) for the power supplies 106 may be managed by circuitry, filters, or software that may be implemented by a person of ordinary skill in the art of plasma processing systems. The person of ordinary skill in the art may design transient control capabilities to make the transient times to be much less than the on and off times of the power supplies 106 during the adsorption and/or desorption processes.

FIG. 5 is a flow diagram for another method 500 for generating an adsorption plasma (e.g., first plasma 302) to form the adsorbed layer 306 on the substrate 110 and a desorption plasma (e.g., second plasma 304) to remove the adsorbed layer 306 from the substrate 110. As noted above, plasma may be generated using a variety of techniques using different types of hardware that may or may not use the same process conditions. Broadly, the scope of the claims may cover embodiments that may use hardware that may not be described in this disclosure. For example, plasma characteristics described in the method 500 may cover several hardware and/or process condition embodiments. Accordingly, the scope of the claims may not be limited to the hardware and/or process condition embodiments described herein.

At block 502, the plasma process chamber 102 may receive a microelectronic substrate 110 which may include any type of semiconductor substrate that may include patterned features or elements that may be used to form microelectronic devices. The semiconductor substrate may include, but are not limited to, any single element substrates (e.g., Si), silicon on insulator substrates, III-V substrates, or epitaxial silicon substrates. The substrate 110 may be placed on the substrate holder 124 that may disposed between the power assembly 114 and a bias electrode.

At block 504, the plasma system 100 may generate a first plasma 302 using a first mixture of process gases in the process chamber 102, as described in the descriptions of FIGS. 1-3. The first plasma 302 comprising one or more radicals and ions within the plasma processing region 116 proximate to the substrate 110. As noted in the description of FIG. 3, the radicals and ions may have a corresponding flux (e.g., $\Gamma_r$, $\Gamma_i$) in the plasma processing region 116. The first plasma 302 may have a radical-to-ion flux ratio (RIR) proximate to the substrate, the first RIR comprising a value of at least 100:1 may range up to 1000:1. The ion energy that may be measured in the plasma processing region, using any known techniques, may be less than 20 eV. In one embodiment, the gas mixture may include a reactant gas and dilution gas that may be maintained at a pressure of at least 40 mTorr up to 500 mTorr. The reactant gas may include an oxygen-containing (e.g., $O_x$) gas or a halogen-containing gas (e.g., $Cl_x$, $F_x$). Microwave power may be applied to the gas mixture and may range between 1000 W to 10,000 W at any driving frequency between 300 MHz and 10 GHz. The first plasma 302 processing time may range between 120 ms and 240 ms before transitioning to a second plasma 304 in the plasma chamber 102.

At block 506, the plasma system 100 may transition to a second plasma 304 using a second mixture of process gases in the process chamber 102, as described in the descriptions of FIGS. 1-3. The transition to the second gas mixture may occur immediately following the end of the first plasma 302 process time or one or more purge cycles that may remove all or at least a portion of the first gas mixture prior to introducing the second gas mixture in the plasma chamber 102. The second gas mixture being different from the first gas mixture by composition and/or concentration of the reactant gas(es), dilution gas(es), or a combination thereof. The second plasma 304 may be formed to achieve an ion energy that is greater than 20 eV and that may range between 40 eV to 70 eV in one embodiment. Also, the $\Gamma_i$ of the second plasma 304 may also be higher than the $\Gamma_i$ of the first plasma.

In one embodiment, these ion energy and flux conditions may be enabled by applying a combination of different power regimes to the second gas mixture. For example, microwave energy may be applied via the power assembly 114 and a bias power 130 (e.g., RF power) may be applied via an electrode in the substrate holder 124. The microwave energy may range from 1000 W to 10,000 W at any frequency between 300 MHz and 10 GHz. In contrast, the bias power 130 may range from 50 W to 150 W with a driving frequency of less than 300 MHz. The second plasma 304 process pressure may range between 5 mTorr to 150 mTorr. The second plasma 304 process time may range up to 550 ms when the microwave power and the bias power 130 are applied to the gas mixture. At the end of the process time, the second plasma 304 may transition back to the first plasma 302 or to another plasma that may form another adsorbed layer 306 on the substrate 110.

At block 508, the plasma chamber 102 may alternate between the adsorption plasma (e.g., first plasma 302 and the desorption plasma (e.g., second plasma 304) in an asymmetrical manner over a period of time. The iterations of each adsorption or desorption process may incorporate the same plasma conditions for each iteration, however each iteration may vary within the process condition boundaries described in any of the embodiments disclosed herein. The adsorption process and the desorption process may be implemented within a period of time that may range from 500 ms to 5000 ms. The period of time may or may not include any purging time between the adsorption/desorption processes.

In addition to the embodiments described above, high precision plasma etching may include other chemistries and/or process sequences that enable selective removal of a monolayer(s) from the substrate 110. Chemistry and/or process sequence selection may vary in view of the substrate 110 surface composition, surface geometry and/or size, sub-surface composition, underlying geometry and/or size, desired etch rate, desired etch selectivity, or any combination thereof. Selections of chemistry and/or processes made by a person of ordinary skill in the art to remove certain films layer without impacting or damaging other exposed layers and/or any underlying layers that may be exposed by the removal process. These additional embodiments may incorporate or use the aforementioned principles of adsorption and desorption and use the transition between those two states to etch a monolayer(s) from the substrate 110.

In some embodiments, the substrate may include a patterned surface that may or may not include different film types that may be exposed to plasma. The combination of film types may have different selectivity with respect to the removal process, such that one film type may have a much higher deposition/passivation rate during adsorption processing and a much higher etch rate during desorption processing. In this way, specific portions of the substrate may be targeted for monolayer(s) removal, while other exposed layers may not be substantially altered by the removal process. Structures formed during microelectronic device manufacturing may include many combinations of structures that may protrude into or out of the substrate 110. The portions may include trenches into the substrate, film stacks, blocks, or fins that may protrude from the substrate 110, or a combination thereof. The structures (e.g., film stacks, fins) may also include different film layers that may or may not have different thicknesses. Chemistry and/or sequence selection may compensate for the size and composition of the structures, as well as their purpose of operation as a microelectronic device. For example, certain structures or film layers may critical for device performance, but other structures or film layers may be considered sacrificial layers that may be removed by subsequent processing or may not impact device electrical performance. A person of ordinary skill in the art may also select chemistries and/or process selections to minimize process time to reduce production cost. In some instances, a person of ordinary skill in the art may transition between different chemistries and/or process sequences when processing a single substrate 110. Again, the in-situ changes may account for changes to the surface composition and/or structure during the process or may intend to target a different exposed portion of the substrate for removal. In certain instances, the in-situ changes may be done to enable the formation of a desired structure within the same exposed area. For example, a person of ordinary skill in the art may alter the chemistry and/or sequence to adjust a trench sidewall profile, a trench bottom profile, or a block or fin structure profile. Many different approaches may be used to address complex structure and device performance needs for microelectronic devices. Many of the high precision etch processes may be explained by a simple exemplary embodiment (see FIG. 6) that illustrates how the selective removal etch may be used to manufacture electronic devices using a patterned substrate 602.

Figure 6:
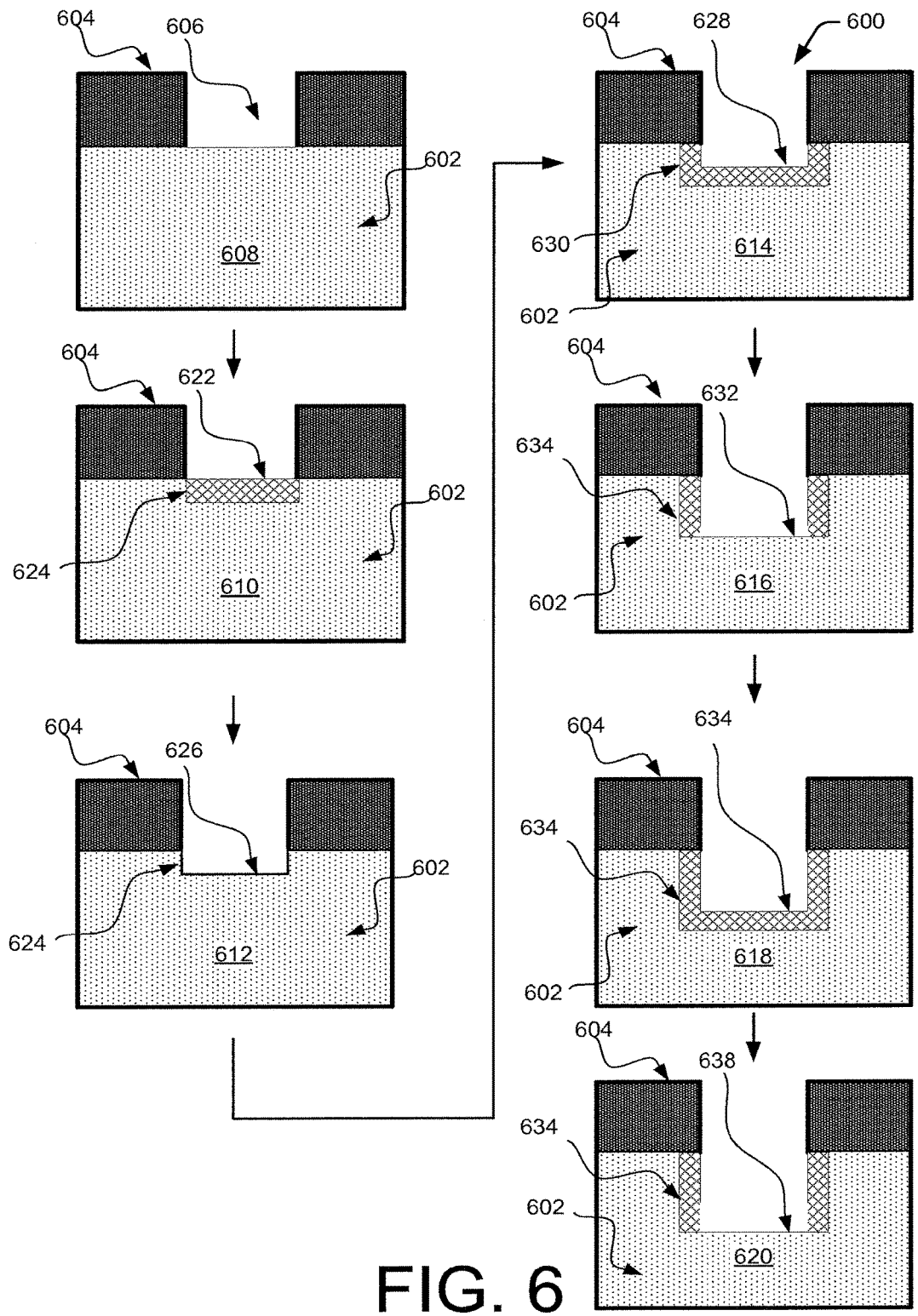
FIG. 6 is an illustration of a representative embodiment of a substrate being treated with successive plasma treatments that remove monolayers from portions of the substrate according to at least one embodiment.

FIG. 6 includes illustration of a representative sequence 600 embodiment of a patterned substrate 602 being treated with successive plasma treatments that may remove monolayers from portions of the patterned substrate 602. The sequence 600 begins in the upper left corner of FIG. 6 with the patterned substrate 602 that may include a overlying layer 604 and exposed portion 606 of the patterned substrate 602. In one embodiment, the overlying layer 604 may include, but is not limited to, a patterned silicon nitride film that expose an underlying substrate 110 of silicon. During the removal process, plasma may interact with the overlying layer 604 and the exposed portion 606. In most instances, the overlying layer 604 may not be impacted or may be minimally impacted by the plasma, such that the overlying layer 604 may not be impacted in a way that may interfere with the treatment of the exposed portion 606. However, in some instances, there may be a small amount of deposition or etching of the overlying layer 604 that may not impact device performance.

FIG. 6 is merely one embodiment to illustrate how a patterned substrate 602 may be treated using adsorption/desorption techniques. Sequence steps 608-620 illustrate one plasma treatment embodiment and other steps may be added or omitted by to achieve a desired result as determined by a person of ordinary skill in the art of plasma processing.

The patterning method for substrate 602 is not shown for purpose of ease of illustration. However, a person of ordinary skill in the art would use known techniques (e.g., deposition, pattern, etch) to form the patterned substrate 608 that includes the substrate 602, a patterned overlying layer 604, and the exposed portion 606 of the substrate 602. FIG. 6 shows one portion of the patterned substrate 608, but this pattern or other patterns may be incorporated across the patterned substrate 608. A person of ordinary skill in the art would know how to optimize the chemistry and/or sequences to account for features across the substrate without undue experimentation. In other embodiments, the pattern and exposed portions may vary in size and structure that may include complex patterns for device electrical isolation features and transistor structures (e.g., gate), or memory structures.

At adsorbed layer embodiment 610, the initial plasma treatment (e.g., first plasma 302) may be used to form the adsorbed layer 622 at the exposed portion 606. The thickness 624 may range between 1-5 monolayers depending on the composition of the substrate 602 and the adsorption plasma chemistry. The adsorbed layer 622, as noted above, may be formed using a combination of elements from the gas mixture/plasma and the substrate 110. The thickness of the adsorbed layer 622 may be limited to the how far the elements can diffuse into the substrate 110.

In this embodiment, the substrate 602 may include, but is not limited to, crystalline silicon that may be treated with an oxygen-containing plasma (e.g., first plasma 302) to form an oxidized layer (e.g., adsorbed layer 622) at the exposed portion 606 of the substrate 602. The oxygen-containing plasma may be tuned to limit the horizontal growth of the adsorbed layer 622, such that the deposition and/or oxidation of the exposed portion 606 increases more quickly perpendicularly to the surface of the substrate 602, than horizontally. In this way, the adsorbed layer 622 may have a thickness 624 of 1-5 monolayers while minimizing the amount of the adsorbed layer 622 that may protrude under the overlying layer 604. As described above, the adsorption plasma (e.g., first plasma 302) may transition to a desorption plasma (e.g., second plasma 304) to remove the adsorbed layer 622 to expose a second portion 626 of the substrate 602. The second portion 626 may include a sidewall thickness 628 and width similar to the adsorbed layer 622 due to the self-limiting aspect of the desorption treatment. In one instance, the desorption treatment may be self-limiting based, at least in part, on a relatively high etch selectivity between the adsorbed layer 622 and the substrate 602. In that the etch rate of the adsorbed layer 622 is much higher than the substrate 602 and the exposed sidewall is less easily removed than the adsorbed layer 622.

The removed adsorbed layer embodiment 612 illustrates the second exposed portion 626 of the substrate 602 following the removal of the adsorbed layer 622. The second exposed portions 626 may relatively conformal to the geometry of the adsorbed layer 622 due to the relatively high etch selectivity between the adsorbed layer 622 and the substrate 110. The second exposed portion 626 may include a sidewall and a bottom wall that may be exposed to subsequent processing that may remove additional monolayers from the substrate 110. Following the removal of the adsorbed layer 622 the desorption plasma may then transition back to an adsorption process that may treat the second exposed portion 626.

The second adsorption embodiment 614 illustrates the results of a second adsorption treatment of the second exposed portion 626 of the substrate 602. The second adsorption process may be limited to depositing, passivating, or oxidizing a new monolayer(s) along the sidewall or the bottom wall of the second exposed portion 626. The second adsorption process may include one or more of the adsorption embodiments disclosed herein or any other process that a person of ordinary skill in the art of plasma process may use to form second adsorbed layer 628. In one embodiment, the second adsorbed layer 628 may passivate or oxidize the second exposed portion 626 in a horizontal and/or vertical direction using one or more of the embodiments disclosed herein. The sidewall process may be self-limiting based on controlling the sidewall deposition, passivation, and/or oxidation rate via one or more process conditions (e.g., pressure, etc.) disclosed herein that may make it less likely that absorbing radicals 310 to contact the sidewall. The second adsorption process may be optimized to form a desired sidewall thickness 630 that may or may not be the same thickness as the bottom portion of the second adsorbed layer 630. In this way, the trench may extend further down into the substrate 602 instead of expanding sideways into the substrate 602.

The second desorption embodiment 616 shows the result of exposing the second adsorbed layer 628 to the second desorption plasma that may be optimized to selectively remove a lower amount of the sidewall relative to the amount of the second adsorbed layer 628 that may be removed at the bottom of the trench. In this way, the third exposed portion 632 may be formed, such that the bottom wall may expose the substrate 110 but the sidewall may not have exposed the substrate 110. In one embodiment, the selective removal of the bottom of the trench may be accomplished by optimizing the direction of the ions 316 in the desorption plasma so that they are less likely to interact with or etch the sidewall than the bottom of the trench. The second desorption plasma may be generated using any of the processes disclosed herein. Again, the second desorption plasma may be transitioned to a third adsorption plasma to treat the third exposed portion 632.

This third adsorption embodiment 618 illustrates the formation of the third adsorbed layer 634 by using a third adsorption plasma using one or more of the adsorption treatments disclosed herein. The third adsorbed layer 634 may include a few more monolayers formed at the bottom of the trench while maintaining the sidewall thickness 636. Lastly, in this embodiment, the third adsorption plasma may transition to the third desorption plasma and expose the substrate 602 as shown in third desorption embodiment 620. The adsorption/desorption process may iterate until the desired trench structure is formed. Also, the adsorption/desorption process may also be applied to other structures and is not limited to the embodiment illustrated in FIG. 6.

Figure 7:
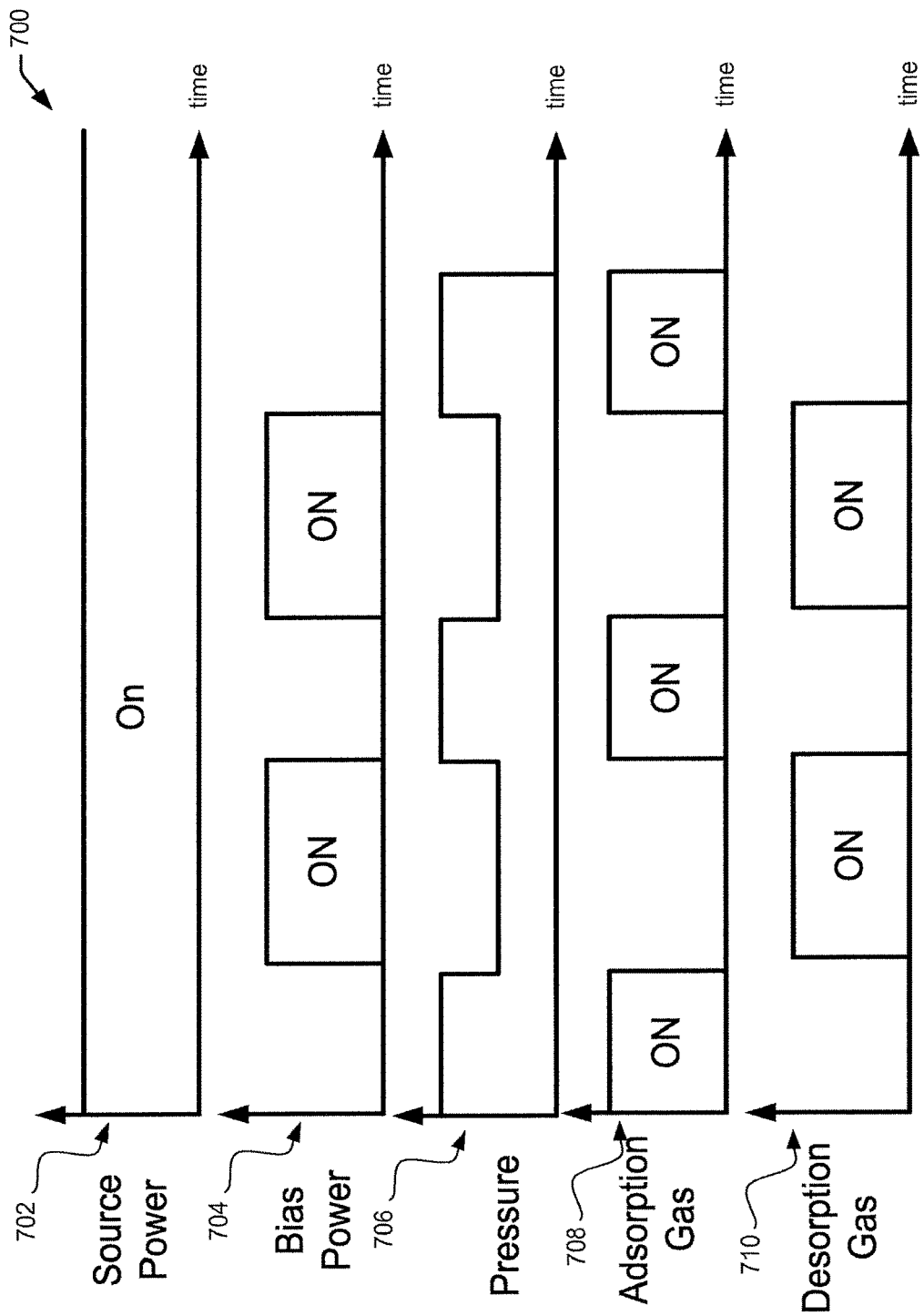
FIGS. 7-9 illustrate multiple embodiments for transitioning between adsorption plasma and desorption plasma that may be used to remove monolayers from portions of the substrate according to one or more embodiments.
Figure 8:
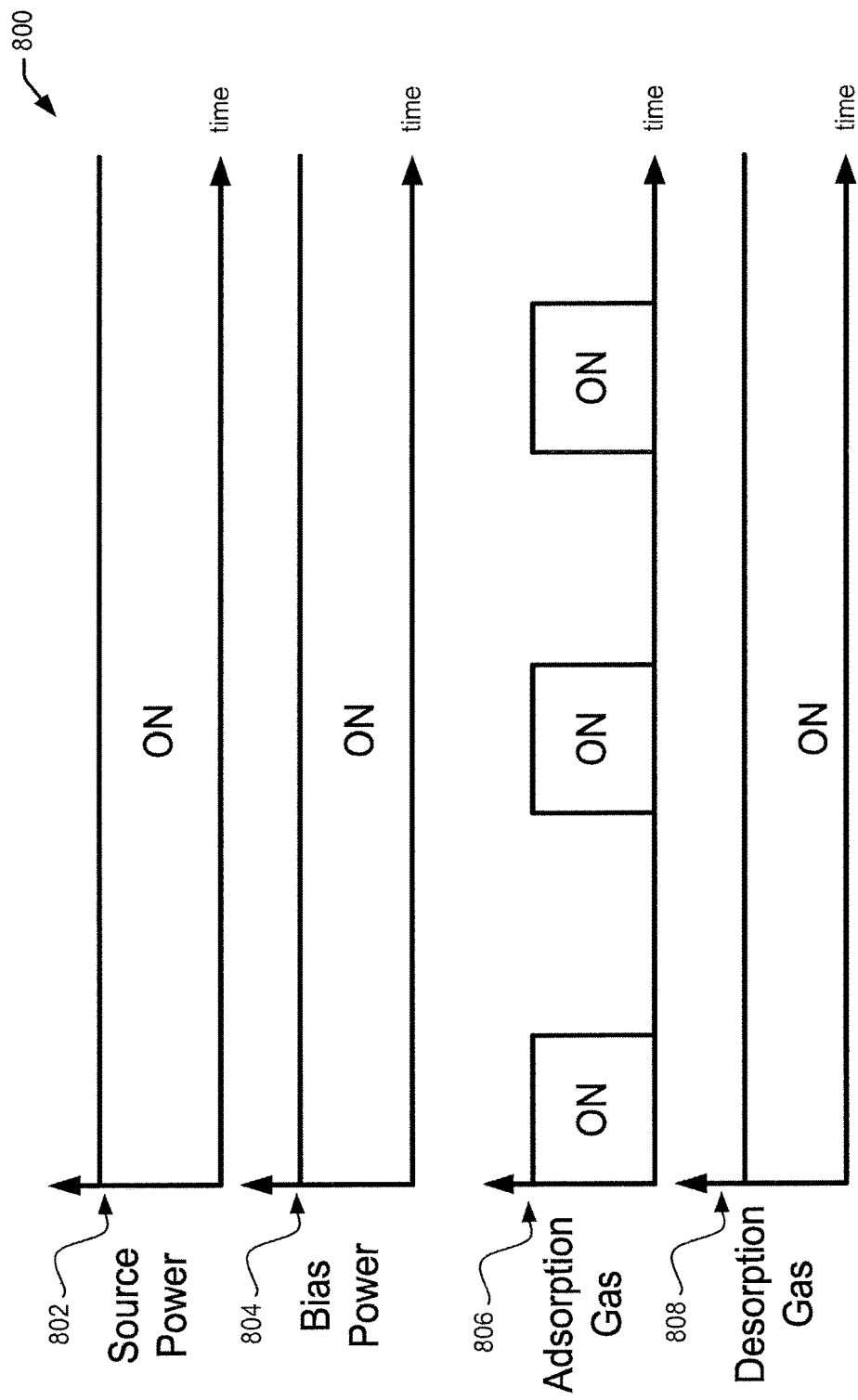
Figure 9:
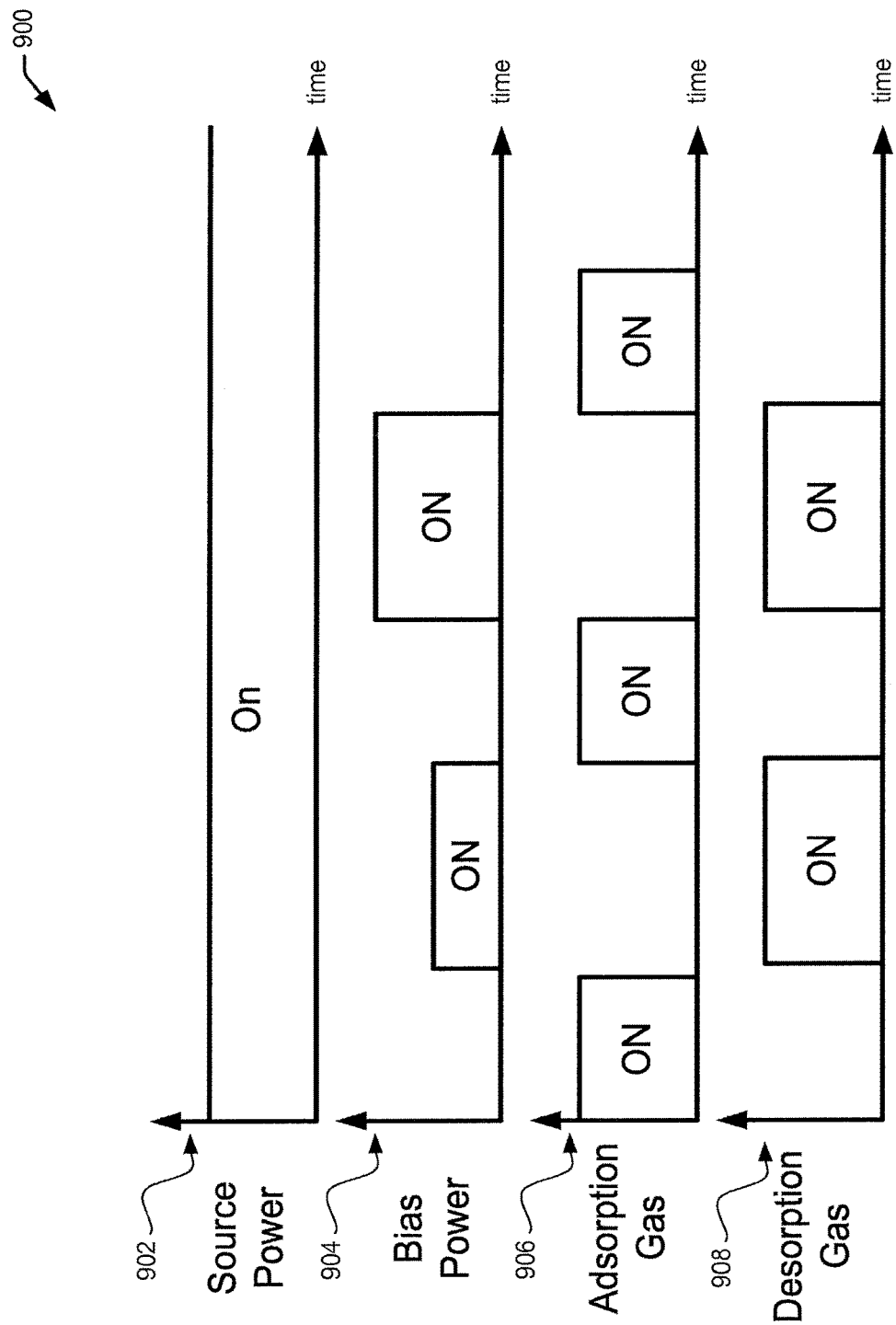

FIGS. 7-9 illustrate multiple processing embodiments for transitioning between adsorption plasma and desorption plasma that may be used to remove monolayers from portions of the substrate 110. These embodiments are intended to describe the relationship between the process conditions that may be implemented by the plasma processing system 100 and not intended to be limited to a specific chemistry scheme or process conditions disclosed herein. The scope of the process condition relationships are not intended to be limited to the illustrated embodiments. For example, any magnitudes or durations implied by the illustrations in FIGS. 7-9 are not intended to limit the scope of the claims or the implementation of any of the embodiments. The magnitudes and durations of the process conditions that may be used are disclosed herein in the disclosure. Further, the sequences may also include omitted portions (e.g., purging, stabilization) that have been omitted from the illustration for the purpose of ease of explanation, and not for limitation. FIGS. 7-9 are arranged to show the process conditions on the y-axis and time on the x-axis and may illustrate at least one potential embodiment of how the plasma processing system 100 may control those conditions relative to each other during substrate 110 treatments.

FIG. 7 figure illustrates a sequence flow diagram 700 of an adsorption/desorption treatment that may be implemented by the plasma process system 100 and is intended to show one embodiment of the transition between adsorption and desorption plasmas (e.g., first plasma 302, second plasma 304). FIG. 7 illustrates two iterations of the adsorption/desorption transition, in that the adsorption and desorption processes are turned "on" and "off" two times. However, in other embodiments, many more iterations may be performed.

In this embodiment, the plasma processing system 100 may control the source power 702, bias power 704, adsorption gas 706, and desorption gas 708 to implement an iterative high precision etching process that removes monolayers from the substrate 110. In this instance, the source power 702 may be applied to the power assembly 114, the bias power 704 may be applied to the substrate holder 124, and the adsorption gas and the desorption gas may be distributed from the gas pathway 120. The chamber pressure may be controlled by the vacuum system 108.

The plasma processing system 100 may alternate between the adsorption and desorption plasma by varying the gas mixture, bias power, and chamber pressure. As shown in FIG. 7, the system 100 may alternate between an adsorption gas 708 mixture and a desorption gas 710 mixture in the plasma chamber 102. In conjunction with the gas mixture changes, the system may also vary the chamber pressure 706 higher or lower depending on which gas mixture may be present. In this embodiment, the chamber pressure 706 may be higher when the adsorption gas 708 may be present than when the desorption gas 710 may be present. Likewise, the bias power 704 be applied to the gas mixture when the desorption gas 710 is present and may be turned off when the adsorption gas 708 is present. In this embodiment, the source power 702 may be continuously applied to the either of the gas mixtures, however continuous source power 702 may not always be required. Although the source power 702 is shown to be constant, it may vary in magnitude in conjunction with the bias power 704, the chamber pressure 706, the adsorption gas 708, or the desorption gas 710. In one specific embodiment, the chamber pressure 706 during adsorption may be at least 40 mTorr and the chamber pressure 706 during desorption may be less than 40 mTorr. Other embodiments related to the FIG. 7 embodiment are described in the descriptions of FIGS. 4, 5, and 10.

FIG. 8 illustrates another sequence flow diagram 800 of a adsorption/desorption treatment that may be implemented by the plasma process system 100 and is intended to show the transition between the adsorption and desorption plasmas (e.g., first plasma 302, second plasma 304). In this embodiment, the illustrated sequence flow diagram 800 shows plasma treatment process that manages the transition between adsorption and desorption by varying the adsorption gas flow 806 while maintaining the source power 802, the bias power 804, and the desorption gas 808. In this instance, the amount of change in the adsorption gas flow 806 is greater than the relative amount of changes that may be implemented to the source power 802, the bias power 804, and the desorption gas 808. Although the FIG. 8 embodiment indicates that the other process conditions are maintained at a constant magnitude, however, these process conditions may vary during the transition, just not to the degree of change achieved by the adsorption gas 806. For example, the adsorption gas 806 may change by 20% or more by volume while the remaining process conditions may be constant or change by less than 20%. These changes may enable the adsorption/desorption transition to enable high precision etching of the substrate 110. In one specific embodiment, the adsorption gas 806 may change by 20% or more by volume, but the remaining process conditions may change by less than 10% during the adsorption/desorption transition.

In other embodiments, the relationship between the adsorption gas 806 and desorption gas 808 may be inverted, such that the transition between adsorption and desorption may be primarily implemented by varying the desorption gas 808. Accordingly, the adsorption gas 806 may be relatively constant compared to the desorption gas 808 which may vary to a much higher degree than the other process conditions. For example, the desorption gas 808 may change by 20% or more by volume while the remaining process conditions may be constant or change by less than 20%. In one specific embodiment, the desorption gas 808 may change by 20% or more by volume, but the remaining process conditions may change by less than 10% during the adsorption/desorption transition.

In other embodiments, the chamber pressure (not shown) may also vary in conjunction with the gas mixture changes, in that the chamber pressure may be higher during the adsorption process and lower during the desorption process as disclosed in embodiments herein. For example, while the source power 802, bias power 804, desorption gas 808 may remain relatively constant compared to the adsorption gas 806, the chamber pressure (not shown) may also vary to higher degree than the power and desorption gas 808 process conditions. Other embodiments related to the FIG. 8 embodiment are described in the description of FIG. 11.

FIG. 9 illustrates one embodiment of the plasma treatment process in which at least one of the process conditions may vary from iteration to iteration of the adsorption/desorption process. One or more of the process conditions (e.g., power, gas mixture, pressure, time) may increase or decrease during several iterations of the adsorption/desorption transition. The changes may be made to account for substrate 110 surface changes (e.g., surface area, composition, etc.) or plasma chamber 102 conditions that may vary over time. Some of these changes may be accounted for by adjusting the process conditions, via magnitude or time, during one or more subsequent iterations. Process condition changes may be made for each iteration or they may be made after two or more iterations.

FIG. 9 illustrates one specific embodiment in which one of the process conditions (e.g., bias power 904) increases in magnitude during one iteration of the adsorption/desorption transition. In this embodiment, the bias power 904 may be increased during the second desorption portion of the treatment. As shown in FIG. 9, the initial bias power 904 magnitude is lower than second iteration of bias power 904 which may be higher to account for the aforementioned substrate 110 changes. For example, the process condition changes may account for a trench in the substrate 110 that gets deeper with additional adsorption/desorption iterations. The increased bias power 904 may increase the amount of energy needed to remove the adsorbed layer 306 from a deeper trench or to minimize the number of ions 316 that may impact the sidewall of the exposed trench, as shown in FIG. 6.

In the FIG. 9 embodiment, the bias power 904 may be increased to account for that surface area change. In this embodiment, the system 100 maintains the source power 902, adsorption gas 906, and desorption gas 1006 at relatively constant magnitude during the adsorption/desorption transitions. But, the relatively constant process conditions may also vary slightly in other embodiments, such that the degree of change for the relatively constant conditions in FIG. 9 may be much less than the change in bias power 904. In one example, the degree of change in the bias power 904 may be greater than 10%, while changes in the other process conditions may be less than 10%.

However, in other embodiments, the bias power 904 may also increase or decrease with the magnitude or the time may change independently of the magnitude. In one embodiment, the desorption time may increase over time to remove a larger amount of the substrate 110 or provide an over etch to remove any residual layer on the substrate 110 or to prepare the substrate 110 for a subsequent process. However, in other embodiments, one or more process conditions may be altered in combination to account for surface area changes or composition changes. Hence, the scope of the FIG. 9 embodiments is not limited to bias power changes and may include source power, gas mixture, pressure, or any combination thereof. Other embodiments related to the FIG. 9 embodiment are also described in the description of FIG. 12.

Figure 10:
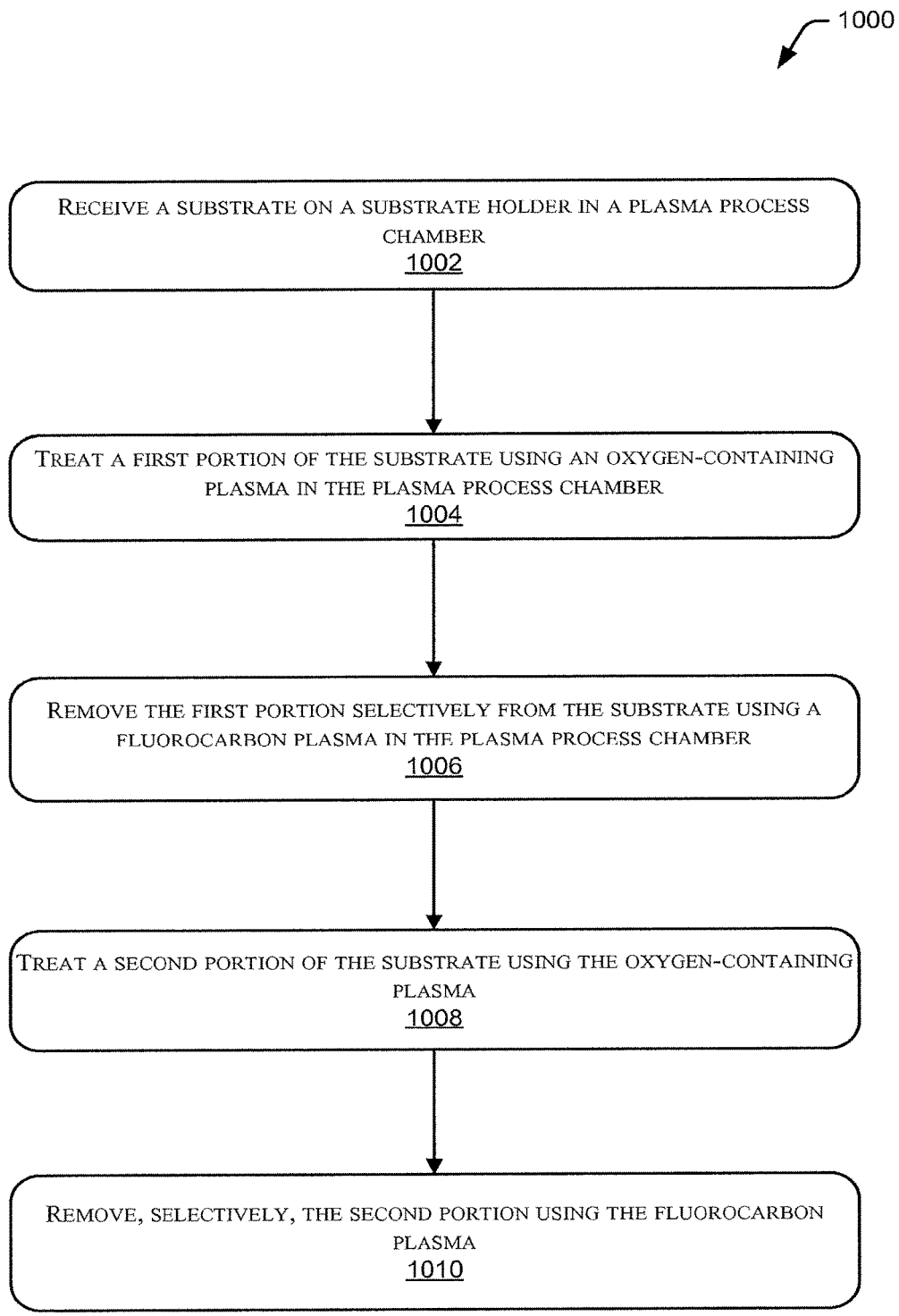
FIG. 10 is a flow diagram for another method for generating a first plasma and a second plasma to treat a substrate according to at least one embodiment.

FIG. 10 illustrates a flow diagram 1000 for another method for generating a first plasma 302 and a second plasma 304 to selectively remove monolayer(s) from a substrate 110. In this embodiment, the transition between the first plasma 302 and the second plasma 304 may be implemented by changing the gas mixture and applied electromagnetic energy to the plasma chamber 102. In certain instances, the treatment may be tailored to certain chemistry regimes in view of the substrate 110 type. In one embodiment, a silicon substrate 110 may be treated by alternating between an oxygen-containing plasma (e.g., first plasma 302) and a fluorocarbon plasma (e.g., second plasma 304).

At block 1002, the plasma process chamber 102 may receive a microelectronic substrate 110 which may include any type of semiconductor substrate that may include patterned features or elements that may be used to form microelectronic devices. The semiconductor substrate 110 may include, but are not limited to, any single element substrates (e.g., Si), silicon on insulator substrates, III-V substrates, or epitaxial silicon substrates. The substrate 110 may be placed on the substrate holder 124 that may disposed between the power assembly 114 and a bias electrode that may be disposed in the substrate holder 124. In one embodiment, the substrate 110 may include a patterned surface (e.g., overlying layer 604) that exposes the portions of the silicon substrate 110, shown in FIG. 6. The overlying layer 604 may be a silicon nitride layer or any other film that may have a higher etch selectivity compared to the underlying substrate 110.

At block 1004, the plasma system 100 may generate an oxygen-containing plasma in the plasma process chamber 102 to treat a first portion of the substrate 110. As noted in the description of FIG. 3, the oxygen-containing plasma may include radicals that may deposit on or passivate the surface of the substrate 110 to form an adsorbed layer 306. The adsorbed layer 306 may include a composition of elements from the plasma gas mixture and the substrate 110. Ideally, the adsorbed layer 306 may sufficiently different from the substrate 110, such that subsequent treatments may remove the adsorbed layer 306 from the substrate 110 without damaging the underlying substrate 110. In practice, the adsorbed layer 306 would have a much higher etch rate than the underlying substrate 110. In one specific embodiment, the etch rate difference may be about an order of magnitude.

The oxygen-containing plasma may be formed by flowing an oxygen-containing gas to the plasma chamber 102 that may be maintained at a pressure between 5 mTorr and 1000 mTorr. A source power between 1000 W and 3000 W (driving frequency >300 MHz) may be applied to the oxygen-containing gas via the power assembly 114 to generate the radicals described in the description of FIG. 3. The radicals may be used to form the adsorbed layer 306 when the oxygen-containing plasma may be exposed to the substrate 110 between 100 ms and 3000 ms.

At block 1006, the plasma processing system 110 may transition to a fluorocarbon plasma to selectively remove the first portion (e.g., adsorbed layer 306) from the substrate 110. The fluorocarbon plasma may include at least a $C_xF_y$ (e.g., $CF_4$, $C_4F_6$ or $C_4F_8$) gas or a $C_xF_yH_z$ gas that may be generated by using a source power of 1000 W to 3000 W (@driving frequency >300 MHz) applied via the power assembly 114 and a bias power between 10 W and 200 W (@driving frequency <300 MHz) applied via the substrate holder 124. The chamber pressure may be maintained between 5 mTorr and 1000 mTorr during the fluorocarbon treatment which may last between 100 ms and 3000 ms. In one specific embodiment, the oxygen-containing gas treatment and the fluorocarbon gas treatment may last for a time period of no more than 5000 ms, such that the adsorbed layer 306 formation and removal may be less than 5000 ms. In other embodiments, the 5000 ms time period may not include any gas purging or pressure stabilization time as described herein. As shown in FIG. 6, the plasma treatment process may be repeated to remove additional monolayers from the substrate 1110.

At block 1008, the plasma processing system 100 may apply another or similar adsorbed layer 306 on the substrate 110 by using the same or similar oxygen-containing plasma using process conditions within the ranges described in the description of block 1004. The oxygen-containing plasma may be used to treat the portion of the substrate 110 that was exposed by the fluorocarbon plasma described in the description of block 1006. FIG. 6 illustrates one exemplary embodiment of the iterative treatments.

In other embodiments, the process conditions for the oxygen-containing plasma may be different from the previous iteration used during the block 1004 process. As noted in the description of FIG. 9, one or more process conditions may vary to account for substrate 110 surface changes or features that may benefit from different surface coverage treatments that may be different from the previous adsorption treatment. One or more of the process conditions may vary by up to 10% in certain instances, but the process condition variation may not be limited to 10% in all instances.

At block 1010, the plasma processing system 100 may transition to a fluorocarbon plasma similar to the one described in the description of block 1006, such that the second adsorbed layer may be selectively removed from the substrate 110 while minimizing the removal of the underlying layer.

In one specific embodiment, the second bias power 904 may vary from the first bias power by 0.5% to 5%. The bias power 904 may increase for successive bias power applications or may transition to a higher setting for at least two or more succession applications. A person or ordinary skill in the art may be able to adjust the bias power to selectively remove monolayers to achieve a desired targets thickness or feature without undue experimentation.

In other embodiments, the reactant gas for the first plasma 302 and the second plasma 304 of the FIG. 10 method 1000 may be substituted with other gases and the substrate 110 being treated may be something other than silicon. The scope of the method 1000 may not be limited to the oxygen-containing gas for the first plasma 302 or the fluorocarbon gas for the second plasma 304. For example, the processing schemes disclosed in the description of FIGS. 1-5 may incorporate the techniques described in the description of FIGS. 7 & 10.

Figure 11:
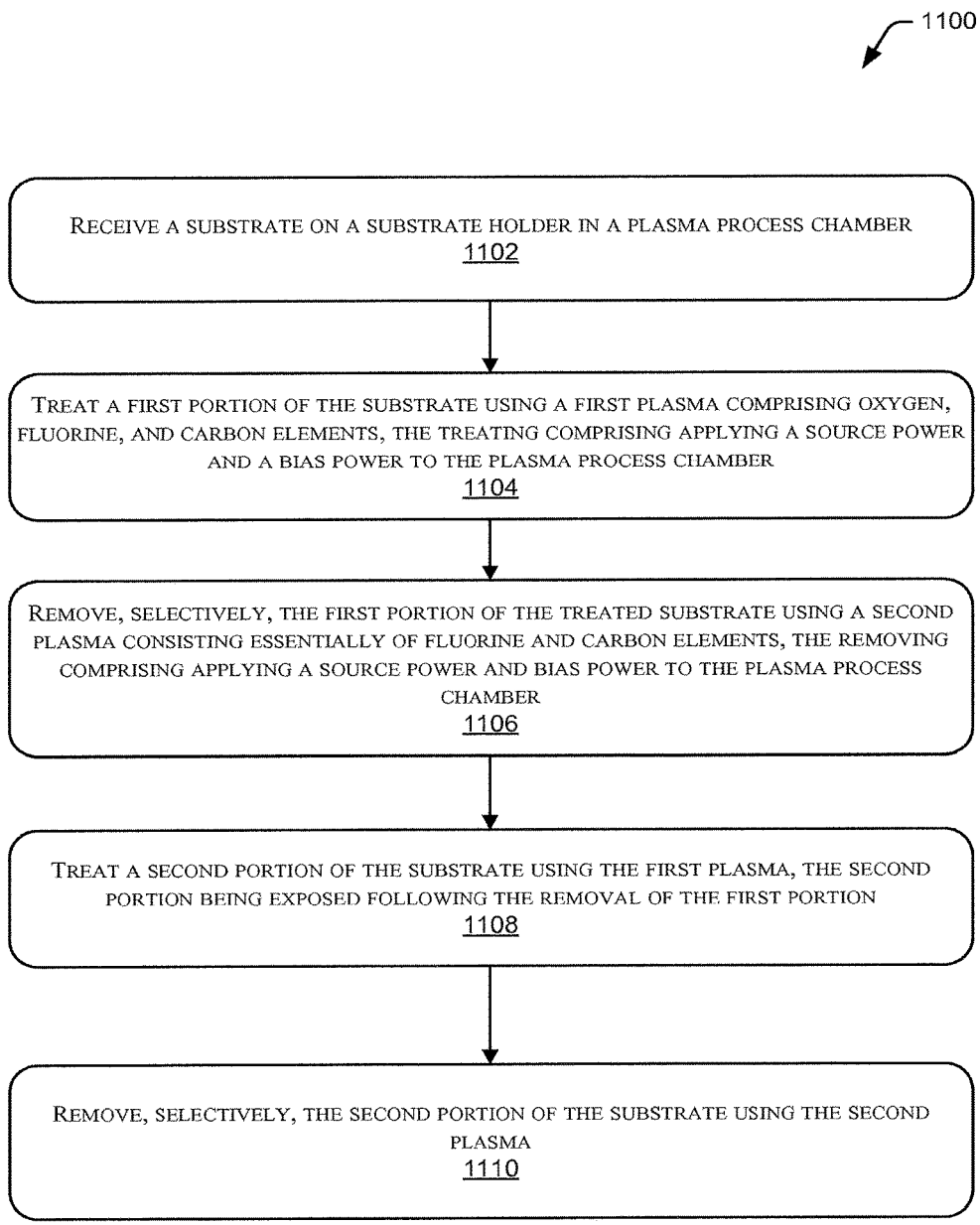
FIG. 11 is a flow diagram for another method for generating a first plasma and a second plasma to treat a substrate according to at least one embodiment.

FIG. 11 is a flow diagram for another method 1100 for generating a first plasma 302 and a second plasma 304 to selectively remove monolayers from the substrate 110. One approach to transitioning between adsorption and desorption may be to incorporate the adsorption gas 806 and the desorption gas 808 into both of the plasma treatments, such that one of the gases is being exchanged in the plasma chamber 102 at a higher rate than the other gas. For example, the one of the gases (e.g., desorption gas 808) may remain at a relatively constant flow rate while the other reactant gas (e.g., adsorption gas 806) may vary to a higher degree to either form or remove the adsorbed layer 306. FIG. 8 illustrates one embodiment in which the adsorption gas 806 is varied to facilitate the transition between adsorption/desorption.

At block 1102, the plasma process chamber 102 may receive a microelectronic substrate 110 which may include any type of semiconductor substrate that may include patterned features or elements that may be used to form microelectronic devices. The semiconductor substrate 110 may include, but are not limited to, any single element substrates (e.g., Si), silicon on insulator substrates, III-V substrates, or epitaxial silicon substrates. The substrate 110 may be placed on the substrate holder 124 that may disposed between the power assembly 114 and a bias electrode that may be disposed in the substrate holder 124. In one embodiment, the substrate 110 may include a patterned surface (e.g., overlying layer 604) that exposes the portions of the silicon substrate 110, shown in FIG. 6. The overlying layer 604 may be a silicon nitride layer or any other film that may have a high etch selectivity compared to silicon or the underlying substrate 110.

At block 1104, the plasma processing system 110 may treat a first portion of the substrate 110 using a first plasma 302 that may include, but is not limited to, oxygen, fluorine, and carbon elements. The gas mixture may include reactant gases ($C_xF_y$, $O_z$, etc.) and dilution gas(es) (e.g. Ar, He, etc.) that may be less chemically reactive with the reactant gas(es) or the substrate 110 when compared to the reactant gas(es). The gas mixture may include a higher oxygen ($O_x$) concentration than the $C_x$ and/or $F_y$ to facilitate a higher radical concentration for adsorption to occur on the substrate 110. Although the adsorption plasma may include C− and F− ions, the radical concentration may be high enough to make the adsorption rate higher than the desorption rate caused by the ions. In one specific embodiment, the oxygen ($O_x$) concentration may be at least 50% by volume of the plasma chamber 102 during the adsorption step.

In this embodiment, the treatment may also include applying a source power between 1000 W and 3000 W (@driving frequency >300 MHz) and a bias power between 10 W and 200 W (@driving frequency <300 MHz) to the plasma process chamber 102 that may be maintained at a between 5 mTorr and 1000 mTorr. The treatment may form a first portion (e.g., adsorbed layer 306) on the substrate 110, such that the first portion may be more easily removed from the substrate 110 by subsequent processing than the underlying layer.

At block 1106, the plasma processing system 100 may transition the first plasma 302 (e.g., adsorption plasma) to a second plasma 304 (e.g., desorption plasma) to selectively remove the first portion of the treated substrate. The second plasma 304 may include a gas mixture consisting essentially of fluorine and carbon elements that may generate ions that may be used to remove the first portion (e.g., adsorbed layer 306) from the substrate 110. In this embodiment, the transition between adsorption and desorption may occur by transitioning the desorption rate to be higher than the adsorption rate. One approach may be to increase the concentration of carbon and fluorine elements within the gas mixture, such that the gas mixture concentration may include at least 50% by volume of any $C_x$, $F_y$, or $C_xF_y$ gas(es). In one specific embodiment, the gas mixture may include $CF_4$, $C_4F_6$, or $C_4F_8$. In other embodiments, the gas mixture may include a small amount of $O_x$, such that the desorption rate being driven by the reactant gas ions will be much higher than any adsorption rate that may be driven by any $O_x$ radicals or plasma that may be present. Hence, the $O_x$ concentration, if present, may be so small that the any $O_x$ elements in the gas mixture may have minimal impact, not going beyond a small dilution effect for the desorption treatment on the substrate 110.

In this embodiment, the treatment may also include applying a source power between 1000 W and 3000 W (@driving frequency >300 MHz) and a bias power between 10 W and 200 W (@driving frequency <300 MHz) to the plasma process chamber 102 that may be maintained at a between 5 mTorr and 1000 mTorr.

At block 1108, the plasma processing system 100 may treat the second portion of the substrate 110 using the same or similar first plasma 302 that may have been used to treat the first portion and may form a second adsorbed layer that may be similar to the first adsorbed layer 306. In this embodiment, the formation of the second absorber layer may occur due to increasing the concentration of the adsorption gas 806 relative to the desorption gas 808 concentration, as broadly illustrated in FIG. 8. As before, the gas mixture may include, but is not limited to, oxygen, fluorine, and carbon elements. In this embodiment, the second treatment may also include applying a source power between 1000 W and 3000 W (@driving frequency >300 MHz) and a bias power between 10 W and 200 W (@driving frequency <300 MHz) to the plasma process chamber 102 that may be maintained at a between 5 mTorr and 1000 mTorr.

At block 1110, the plasma processing system 100 may transition to a second plasma 304 to selectively remove the second portion (e.g., second adsorbed layer) from the substrate 110, such that the desorption rate of the second portion may be higher than the desorption rate of the underlying layer. In this embodiment, the treatment may also include applying a source power between 1000 W and 3000 W (@driving frequency >300 MHz) and a bias power between 10 W and 200 W (@driving frequency <300 MHz) to the plasma process chamber 102 that may be maintained at a between 5 mTorr and 1000 mTorr.

In other embodiments, the reactant gas for the first plasma 302 and the second plasma 304 of the FIG. 11 method 1100 may be substituted with other gases and the substrate 110 being treated may be something other than silicon. For example, the processing schemes disclosed in the description of FIGS. 1-5 may incorporate the processing techniques disclosed in method 1100 or the processing schemes described in FIG. 8 or 9.

Figure 12:
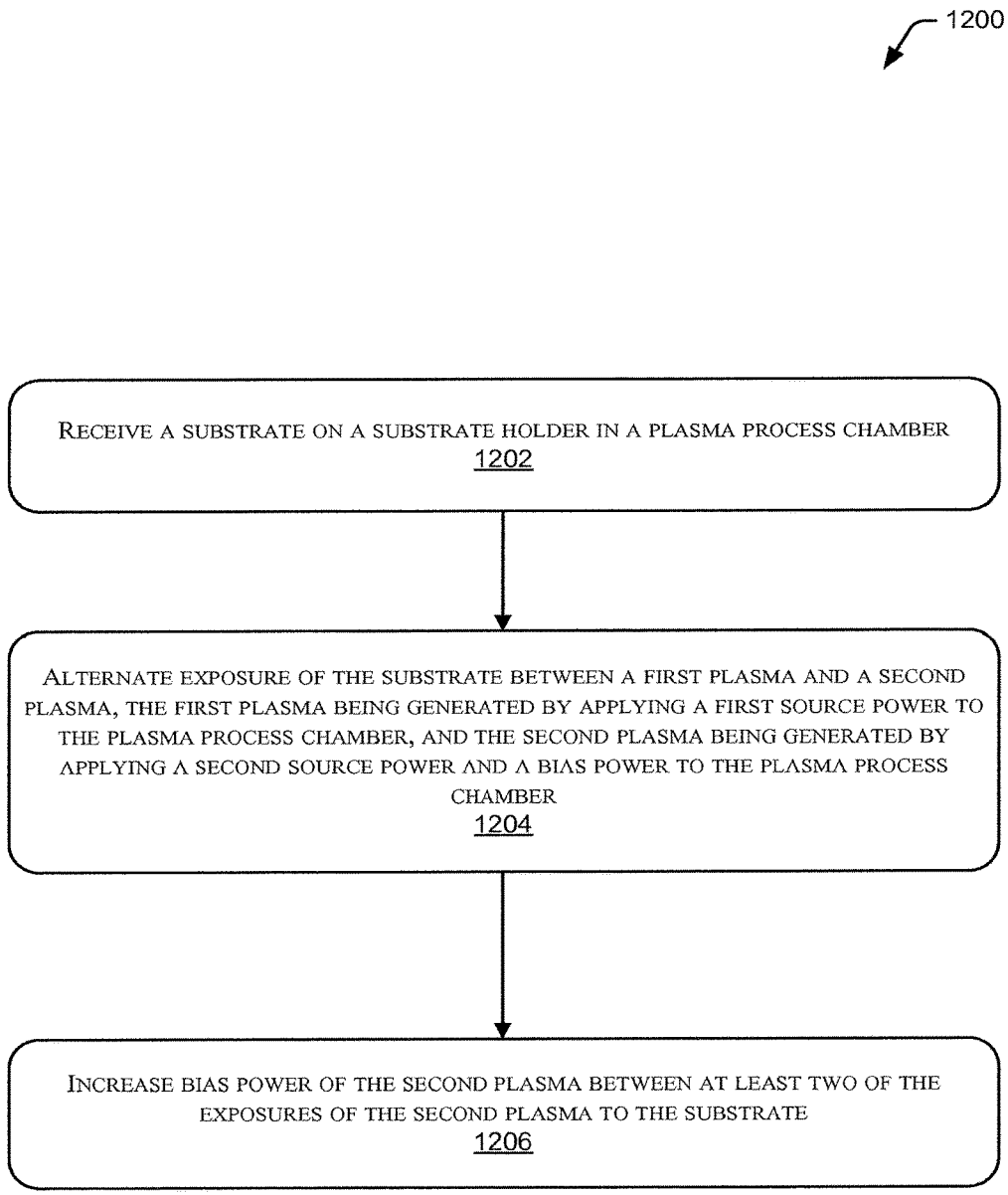
FIG. 12 is a flow diagram for another method for generating a first plasma and a second plasma to treat a substrate according to at least one embodiment.

FIG. 12 is a flow diagram for another method 1200 for generating a first plasma 302 and a second plasma 304 to treat a substrate and alternating between the two plasma regimes and changing one or more process conditions (e.g., power, pressure, gas mixture) for one or more iterations. The scope of the disclosure should not be limited to the bias power embodiment illustrated in FIG. 9, which is merely representative of one embodiment for iterative process condition optimization. The process conditions may be altered between iterations to account for substrate surface changes in composition (e.g., type or concentration) or structure (e.g., surface area). In one specific embodiment, the bias power 904 applied during the desorption step may be increased at least once in subsequent desorption steps.

At block 1202, the plasma process chamber 102 may receive a microelectronic substrate 110 which may include any type of semiconductor substrate that may include patterned features or elements that may be used to form microelectronic devices. The semiconductor substrate 110 may include, but are not limited to, any single element substrates (e.g., Si), silicon on insulator substrates, III-V substrates, or epitaxial silicon substrates. The substrate 110 may be placed on the substrate holder 124 that may disposed between the power assembly 114 and a bias electrode that may be disposed in the substrate holder 124. In one embodiment, the substrate 110 may include a patterned surface (e.g., overlying layer 604) that exposes the portions of the silicon substrate 110, shown in FIG. 6. The overlying layer 604 may be a silicon nitride layer or any other film that may have a high etch selectivity compared to silicon or the underlying substrate 110.

At block 1204, the plasma process system 100 may alternatingly expose the substrate 110 between a first plasma 302 and a second plasma 304 to remove one or more monolayers from the substrate 110. The first plasma 302 may be generated using any of the adsorption plasma processes disclosed herein, followed by the second plasma 304 that may be generated by any of the desorption plasma processes disclosed herein. As noted above, the first plasma 302 may form the adsorbed layer 306 and the second plasma 304 may be used to selectively remove the adsorbed layer 306 from the substrate 110.

At block 1206, the plasma processing system 100 may increase the bias power 904 between at least two of the exposures of the second plasma 304 to the substrate 110. For example, in one embodiment the bias power may increase between each iteration of the second plasma 304. However, in other embodiments, the bias power may not be required to increase for each iteration. In these embodiments, the bias power may change (e.g., increase or decrease) between 0.5% to 5% of the previous bias power exposure. In addition to the magnitude change, the bias power time may also vary between 0.5% to 5% of the previous bias power exposure time. However, in other embodiments, the bias power may change by greater than 5% between exposures.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for treating a substrate, comprising:
    receiving a substrate on a substrate holder in a plasma process chamber, a patterned overlying layer being formed over the substrate to form a first exposed portion of the substrate;
    treating a first exposed portion of the substrate using a first plasma in the plasma process chamber so as to form a first adsorbed layer in the first exposed portion of the substrate, the first adsorbed layer being formed using a combination of elements from the first plasma and the substrate, the first adsorbed layer extending into the substrate with a first thickness;
    removing the first adsorbed layer selectively from the substrate using a second plasma in the plasma process chamber so that a second exposed portion of the substrate is formed, the second exposed portion of the substrate having sidewalls and a bottom;
    treating the second exposed portion of the substrate using the first plasma so as to form a second adsorbed layer in the second exposed portion of the substrate, the second adsorbed layer being formed using the combination of elements from the first plasma and the substrate, the second adsorbed layer having side portions extending into the sidewalls of the second exposed portion of the substrate with a second thickness, and a bottom portion extending into the bottom of the second exposed portion of the substrate with a third thickness; and
    removing, selectively, the second adsorbed layer using the second plasma.

2. The method of claim 1, wherein the first plasma comprises an oxygen-containing plasma and the second plasma comprises a fluorocarbon-containing plasma that comprises a $C_xF_yH_z$ gas.

3. The method of claim 1, wherein the treating the first exposed portion or the second exposed portion of the substrate comprises applying a source power between 1000 W and 3000 W to the plasma process chamber being maintained at a first pressure between 5 mTorr and 1000 mTorr.

4. The method of claim 1, wherein the removing the first adsorbed layer or the second adsorbed layer comprises:
    applying a source power between 1000 W and 3000 W and a bias power between 10 W and 200 W to the plasma process chamber; and
    maintaining the plasma process chamber at a second pressure between 5 mTorr and 1000 mTorr in the plasma process chamber.

5. The method of claim 1, further comprising alternating between the first plasma and the second plasma.

6. The method of claim 5, wherein the alternating comprises increasing the bias power by at least 5% for successive iterations of the second plasma.

7. The method of claim 1, wherein the treatment of the first exposed portion or the second exposed portion of the substrate comprises a time between 100 ms and 3000 ms.

8. The method of claim 1, wherein the removing of the first adsorbed layer or the second adsorbed layer comprises a time between 100 ms and 3000 ms.

9. The method of claim 1, wherein the treating the first exposed portion of the substrate and removing the first adsorbed layer comprises a time period of no more than 5 s.

10. The method of claim 1, wherein the removing, selectively, the second adsorbed layer using the second plasma comprises:
    removing the bottom portion of the second adsorbed layer fully to exposed the substrate; and
    removing a part of the side portions of the second adsorbed layer.

* * * * *